United States Patent
Volbers et al.

(10) Patent No.: US 11,827,961 B2
(45) Date of Patent: Nov. 28, 2023

(54) FECOV ALLOY AND METHOD FOR PRODUCING A STRIP FROM AN FECOV ALLOY

(71) Applicant: Vacuumschmelze GmbH & Co. KG, Hanau (DE)

(72) Inventors: Niklas Volbers, Hanau (DE); Michael Müller, Hanau (DE); Jan Frederik Fohr, Hanau (DE)

(73) Assignee: VACUUMSCHMELZE GMBH & CO. KG, Hanau (DE)

( * ) Notice: Subject to any disclaimer, the term of this patent is extended or adjusted under 35 U.S.C. 154(b) by 0 days.

(21) Appl. No.: 17/554,247

(22) Filed: Dec. 17, 2021

(65) Prior Publication Data
US 2022/0195569 A1    Jun. 23, 2022

(30) Foreign Application Priority Data
Dec. 18, 2020    (DE) .................... 102020134294.2

(51) Int. Cl.
*C22C 38/10*    (2006.01)
*C22C 38/12*    (2006.01)
(Continued)

(52) U.S. Cl.
CPC ............ *C22C 38/10* (2013.01); *C21D 8/0226* (2013.01); *C21D 8/0236* (2013.01);
(Continued)

(58) Field of Classification Search
None
See application file for complete search history.

(56) References Cited

U.S. PATENT DOCUMENTS

| 1,862,559 A | 6/1932 | White et al. |
| 2,717,223 A | 9/1955 | Binstock et al. |

(Continued)

FOREIGN PATENT DOCUMENTS

| DE | 1029845 B | 5/1958 |
| DE | 1049409 B | 1/1959 |

(Continued)

OTHER PUBLICATIONS

Aspden, R.G. et al., "Anisotropic and Heterogeneous Nucleation During the Gamma to Alpha Transformation in Iron," Acta Metallurgica, vol. 16, Aug. 1968, 9 pages.
(Continued)

*Primary Examiner* — Anthony M Liang
(74) *Attorney, Agent, or Firm* — Dickinson Wright PLLC

(57) ABSTRACT

In an embodiment a FeCoV alloy is provided with a composition consisting essentially of 30 wt %≤Co≤55 wt %, 0.4 wt %≤V≤1.5 wt %, 0 wt %≤Nb≤0.15 wt %, 0.0 wt %≤Ta≤0.20 wt %, 0.04 wt %≤Nb+0.5·Ta≤0.15 wt %, max. 0.02 wt % C, 0.0 wt %≤Si≤0.50 wt %, 0.0 wt %≤Al≤0.50 wt %, max. 0.5 wt % Mn, max. 0.5 wt % Cr, max. 0.5 wt % Ni, max. 0.5 wt % W, max. 0.5 wt % Mo, max. 0.5 wt % Zr, the rest Fe and up to 1 wt % of other impurities, and having a phase transition from a ferritic α-phase region to a mixed ferritic/austenitic α+γ-region that takes place at a transition temperature T(α/α+γ), where T(α/α+γ)≥900° C., preferably ≥920° C., preferably ≥940° C.

15 Claims, 4 Drawing Sheets

(51) Int. Cl.
*C22C 38/02* (2006.01)
*C22C 38/04* (2006.01)
*C22C 38/06* (2006.01)
*C22C 38/44* (2006.01)
*C22C 38/50* (2006.01)
*C21D 8/02* (2006.01)
*C23C 16/40* (2006.01)

(52) U.S. Cl.
CPC ......... *C21D 8/0263* (2013.01); *C21D 8/0273* (2013.01); *C22C 38/02* (2013.01); *C22C 38/04* (2013.01); *C22C 38/06* (2013.01); *C22C 38/12* (2013.01); *C22C 38/44* (2013.01); *C22C 38/50* (2013.01); *C23C 16/403* (2013.01); *C23C 16/405* (2013.01); *C21D 2211/001* (2013.01); *C21D 2211/005* (2013.01)

(56) References Cited

U.S. PATENT DOCUMENTS

| | | | |
|---|---|---|---|
| 2,992,952 | A | 7/1961 | Assmus et al. |
| 3,065,118 | A | 11/1962 | Wawrousek et al. |
| 3,078,198 | A | 2/1963 | Wiener |
| 3,148,092 | A | 9/1964 | Shull, Jr. |
| 3,166,408 | A | 1/1965 | Chen |
| 3,240,638 | A | 3/1966 | Wiener et al. |
| 3,282,747 | A | 11/1966 | Foster et al. |
| 3,466,201 | A | 9/1969 | Assmus et al. |
| 3,597,286 | A | 8/1971 | Thornburg |
| 3,634,072 | A | 1/1972 | Ackermann et al. |
| 3,695,944 | A | 10/1972 | Stroble |
| 3,856,568 | A | 12/1974 | Tanaka et al. |
| 3,868,278 | A | 2/1975 | Foster et al. |
| 3,977,919 | A | 8/1976 | Foster et al. |
| 4,367,100 | A | 1/1983 | Miller, Jr. |
| 4,537,792 | A | 8/1985 | Kitayama et al. |
| 5,394,721 | A | 3/1995 | Iwayama et al. |
| 5,507,883 | A | 4/1996 | Tanaka et al. |
| 5,685,920 | A | 11/1997 | Tanaka et al. |
| 6,146,474 | A | 11/2000 | Coutu et al. |
| 6,423,156 | B1 | 7/2002 | Günther et al. |
| 6,685,882 | B2 | 2/2004 | Deevi et al. |
| 7,905,965 | B2 | 3/2011 | Gigliotti et al. |
| 8,943,677 | B2 | 2/2015 | Gerster et al. |
| 10,742,077 | B2 | 8/2020 | Volbers |
| 2004/0126483 | A1 | 7/2004 | Heimann et al. |
| 2005/0268994 | A1 | 12/2005 | Gerster et al. |
| 2008/0121315 | A1 | 5/2008 | Gigliotti et al. |
| 2011/0050376 | A1 | 3/2011 | Gerster et al. |
| 2012/0156441 | A1 | 6/2012 | Gerster et al. |
| 2017/0162295 | A1 | 6/2017 | Sashi et al. |
| 2018/0223401 | A1 | 8/2018 | Waeckerle et al. |
| 2019/0203311 | A1* | 7/2019 | Palzer .................. C21D 8/0268 |
| 2019/0360065 | A1* | 11/2019 | Volbers .................. C22C 38/28 |
| 2020/0299820 | A1 | 9/2020 | Volbers |
| 2020/0318212 | A1* | 10/2020 | Fohr .................. C22C 38/42 |
| 2020/0325564 | A1 | 10/2020 | Fohr et al. |
| 2022/0074011 | A1 | 3/2022 | Han et al. |

FOREIGN PATENT DOCUMENTS

| | | | |
|---|---|---|---|
| DE | 1101471 | B | 3/1961 |
| DE | 1106354 | B | 5/1961 |
| DE | 1109197 | B | 6/1961 |
| DE | 1115279 | B | 10/1961 |
| DE | 1180954 | B | 11/1964 |
| DE | 1483516 | A1 | 2/1969 |
| DE | 2129930 | A1 | 12/1971 |
| DE | 2247269 | A1 | 4/1973 |
| DE | 3336448 | A1 | 4/1984 |
| DE | 19754996 | A1 | 6/1999 |
| DE | 19750066 | C1 | 8/1999 |
| DE | 102009038730 | A1 | 1/2010 |
| DE | 102008039326 | A1 | 2/2010 |
| DE | 102012105605 | A1 | 1/2013 |
| DE | 102018112491 | A1 * | 5/2019 ........... C21D 11/005 |
| DE | 102018112491 | A1 | 5/2019 |
| DE | 102019107422 | A1 | 9/2020 |
| EP | 0695812 | A1 | 2/1996 |
| EP | 0824755 | B1 | 1/2001 |
| EP | 0935008 | B1 | 10/2002 |
| EP | 1145259 | B1 | 12/2002 |
| EP | 1482072 | A2 | 12/2004 |
| EP | 1475450 | B1 | 11/2005 |
| EP | 2791377 | B1 | 7/2018 |
| EP | 3396022 | A1 | 10/2018 |
| EP | 3396681 | A1 | 10/2018 |
| EP | 3541969 | A1 | 9/2019 |
| GB | 2207927 | B | 2/1991 |
| GB | 2492406 | A | 1/2013 |
| GB | 2495465 | A | 4/2013 |
| GB | 2550593 | A | 11/2017 |
| JP | S6240344 | A | 2/1987 |
| WO | 00/05733 | A2 | 2/2000 |
| WO | 2013/125790 | A1 | 8/2013 |
| WO | 2014/180610 | A1 | 11/2014 |
| WO | 2018/091169 | A1 | 5/2018 |
| WO | 2018091694 | A1 | 5/2018 |
| WO | 2020130643 | A1 | 6/2020 |

OTHER PUBLICATIONS

Krause, R.F. et al., "Magnetic properties of textured annealed commercial black plate," J. Appl. Phys., vol. 52, No. 3, Mar. 1981, 3 pages.

Sung, Jin Kyung et al., "Efficient Generation of Cube-on-Face Crystallographic Texture in Iron and its Alloys," ISIJ International, vol. 51, No. 2, 2011, 7 pages.

* cited by examiner

FECOV ALLOY AND METHOD FOR PRODUCING A STRIP FROM AN FECOV ALLOY

This U.S. patent application claims priority to DE Patent Application No. 10 2020 134 294.2, filed Dec. 18, 2020, the entire contents of which is incorporated herein by reference in its entirety.

BACKGROUND

1. Technical Field

The invention relates to a FeCoV alloy and a method for producing a FeCoV alloy.

2. Related Art

The current trend towards electrification is leading to increased demand for electrical machines offering high power density coupled with high efficiency. One component that can improve these properties is the soft magnetic material used in the stators and rotors of these electrical machines. Its purpose is to guide magnetic flux.

This material typically takes the form of iron silicon (FeSi) alloys with a Si content of 2% to 4 wt %. They have an adequate characteristics profile for most applications and are also very readily commercially available. However, these materials do not always adequately meet the power density and efficiency standards demanded by very sophisticated electrical machines with the highest requirements such as those demanded in motor racing or aviation, for example.

Materials comprising iron, cobalt and vanadium (FeCoV) have been in use in the electric generators used in aviation for many decades because the addition of cobalt can increase saturation polarisation. These alloys, also known as Vanadium Permendur, with a basic composition of 49% Fe, 49% Co and 2% V, have a saturation polarisation Js of up to 2.30 T, which significantly exceeds the value of approx. 2 T of FeSi-based alloys. In practice, it is therefore possible using FeCoV to construct electric motors with 20% to 50% higher output at the same volume.

Furthermore, the low crystal anisotropy K1 of the FeCoV material results in a very low coercive field strength Hc, which is typically in the region below 100 A/m (=1 A/cm). In combination with an electrical resistance of approx. 0.4 $\mu\Omega m$ (=40 $\mu\Omega cm$), which corresponds approximately to the value of typical FeSi alloys, this in turn results in very low magnetisation losses $P_{Fe}$. The efficiency of electrical machines using Vanadium Permendur as the stator material is therefore very high.

However, the already very high standards demanded of electric motors are currently rising even further, in particular due to new applications in the field of electric aviation. It is currently already possible using FeCoV materials to construct motors with a power-to-weight ratio of 5 kW/kg, but long-term objectives are to achieve 20 kW/kg. Meeting these objectives will inter alia require further improvements to soft magnetic materials in terms of power density and efficiency.

The key parameter in achieving high power density in this field is saturation polarisation Js as a measure of the maximal possible magnetisation of the material. In practice, however, the inductions B(H) at field strengths H of between 100 A/m (=1 A/cm) and 20 kA/m (=200 A/cm) are also particularly relevant as they correspond to the dynamic range to which the majority of the material is subjected.

To achieve high levels of efficiency, the energy required for magnetisation should be minimised. This parameter, also referred to as magnetisation losses $P_{Fe}$, consists of hysteresis losses, eddy-current losses and anomalous losses. To set low hysteresis losses, coercive field strength Hc should be as small as possible. A reduction in eddy-current losses can be achieved by high specific electrical resistance $\rho_{el}$ and low sheet thickness d. Anomalous losses are determined by domain structure and can be influenced by grain size and composition. Anomalous losses in an FeCoV system with approximately equal amounts of Fe and Co are relatively low and it is therefore necessary to minimise hysteresis and eddy-current losses in order to reduce magnetisation losses substantially.

Both these aspects should be taken into account when optimising FeCo composition, i.e. an improved material should have high saturation polarisation and high permeability on one hand and low total losses due to small hysteresis and eddy-current fractions on the other.

SUMMARY

The object of the invention is therefore to provide an FeCoV alloy that has high saturation polarisation, high permeability and low total losses and can also be produced on an industrial scale.

According to the invention an FeCoV alloy is provided with a composition consisting essentially of:

30 wt %≤Co≤55 wt %, preferably 45 wt %≤Co≤55 wt %,
0.4 wt %≤V≤1.5 wt %, preferably 0.6 wt %≤V≤1.35 wt %, preferably 0.8 wt %≤V≤1.2 wt %,
0.0 wt %≤Nb≤0.15 wt %, preferably 0.0 wt %≤Nb≤0.10 wt %, preferably 0.04 wt %≤Nb≤0.10 wt %,
0.0 wt %≤Ta≤0.30 wt %, preferably 0.0 wt %≤Ta≤0.20 wt %, preferably 0.0 wt %≤Ta≤0.15 wt %,
0.0 wt %≤Nb+0.5·Ta≤0.3 wt %, preferably 0.0 wt %≤Nb+0.5·Ta≤0.2 wt %, preferably 0.04 wt %≤Nb+0.5·Ta≤0.15 wt %, preferably 0.04 wt %≤Nb+0.5·Ta≤0.10 wt %,
max. 0.02 wt % C, preferably max. 0.01 wt %, preferably max. 0.005 wt %,
0.0 wt %≤Si≤0.50 wt %, preferably 0.0 wt %≤Si≤0.30 wt %,
0.0 wt %≤Al≤0.50 wt %, preferably 0.0 wt %≤Al≤0.30 wt %,
max. 0.5 wt % Mn, max. 0.5 wt % Cr, max. 0.5 wt % Ni, max. 0.5 wt % W, max. 0.5 wt % Mo, max. 0.5 wt % Zr,
the rest Fe and up to 1 wt % of other impurities.

wt % denotes weight percent. The impurities may contain one or more elements from the group consisting of O, N, S, P, Ce, Ti, Mg and Be.

The FeCoV alloy has a phase transition from a ferritic α-phase region to a mixed ferritic/austenitic α+γ that takes place at a transition temperature T(α/α+γ), where T(α/α+γ) ≥900° C., preferably ≥905° C., preferably ≥910° C., preferably ≥920° C., preferably ≥940° C.

As the temperature rises, the phase transition between the ferritic α-phase region and the mixed ferritic/austenitic α+γ-region takes place at a first transition temperature $T_{\alpha/\alpha+\gamma}$ and as the temperature increases further the transition between the mixed ferritic/austenitic α+γ-region and the austenitic γ-phase region takes place at a second transition temperature $T_{\alpha+\gamma/\gamma}$.

The FeCoV alloy according to the invention and the associated production route make it possible to produce soft magnetic sheets that have a plurality of advantageous features in terms of soft magnetic properties when compared to known FeCo-2V alloys:

high saturation polarisation to achieve maximum flux densities at high field strengths,
very high maximum permeability, making high flux densities B(H) possible even at low outer field strengths H,
very low coercive field strength, making it possible to reduce hysteresis losses,
low eddy-current losses, making it possible in combination with these low hysteresis losses to minimise total magnetisation losses.

The combination of these properties makes it possible to produce laminated cores for use in electric motors and generators that have high inductions over a broad field strength range and, therefore, extremely high power density. Due to the high saturation it is possible to produce particularly high maximum torque. At the same time, low magnetisation losses permit very good efficiency.

These properties can be achieved by increasing the maximum temperature of final annealing so that it is above 900° C., preferably above 905° C., preferably above 910° C., preferably above 920° C. or preferably above 940° C., for example. The alloy undergoes final annealing at its final thickness.

In an FeCoV system with a Co content of over 30 wt %, however, the maximal possible final annealing temperature is restricted by the phase transition $\alpha/\alpha+\gamma$. Good soft magnetic properties can only be set by annealing in the ferritic $\alpha$-region. Exceeding the phase transition during heat treatment results in the permanent impairment of magnetic properties, as manifested by a sharp increase in coercive field strength and a reduction in maximum permeability, for example.

By raising the phase boundary line $T(\alpha/\alpha+\gamma)$ it is possible to perform magnetic final annealing taking place in the ferritic $\alpha$-region at higher temperatures.

According to the invention the increase in phase transition is the result of a reduction in the V content to 0.4 wt % to 1.50 wt %. It has been found that a reduction in V content of 0.1 wt % results in a rise in phase transition $T(\alpha/\alpha+\gamma)$ of 4.5° C. The temperature $T_{max}$, at which magnetic final annealing takes place can be increased in equal measure. V content can be reduced further to below 1.35 wt %, or below 1.2 wt %, in order to further increase the phase transition $T(\alpha/\alpha+\gamma)$ and so to further increase the maximum temperature during final annealing and further improve magnetic properties.

This annealing therefore has several advantages. The higher self-diffusion produced at the higher temperature results in stronger grain growth with the same annealing time, i.e. the grain size dk is higher after final annealing. According to Mager's relationship (Hc $\alpha$ 1/dk), this results in lower coercive field strength Hc and, ultimately, also in higher permeability. The reducing effect of the hydrogen is improved, i.e. oxides can be better reduced and impurities that are close to the surface and may be disadvantageous for the soft magnetic properties are also reduced. The effect of this surface improvement is particularly significant for thin strips measuring 0.25 mm or less and leads to an improvement in soft magnetic properties.

In a further positive effect, a reduction in V content leads to an increase in saturation polarisation. With V contents of between 0.4 wt % and 1.5 wt %, 0.6 wt %≤V≤1.35 wt % or 0.8 wt %≤V≤1.2 wt %, it is possible to achieve saturation values J160 of over 2.32 T and up to 2.37 T depending on V content.

It has been established that the ratio of Co to Fe has an influence on induction B, in particular at lower H values such as H=1 A/cm and 3 A/cm, for example. In addition to texture formation, the Co/Fe ratio in the alloys can most notably influence order and so magnetocrystalline anisotropy and so the soft magnetic properties that can be achieved. It has been established that magnetic properties B1 (i.e. B at H=1 A/cm) and B3 (i.e. B at H=3 A/cm) can be improved where 0.94≤Co/Fe≤1.01, preferably 0.97≤Co/Fe≤1.005, the Co/Fe ratio being calculated from the wt % of Co and Fe without taking the contents of impurities C, S, N and O into account in the calculation.

Reduced V content results in lower electrical resistance compared to VACODUR 49. Depending on the sheet thickness and application, this may lead to increased eddy-current losses. However, as electrical resistance has a purely linear effect on eddy-current losses, which sheet thickness has a quadratic effect, it is possible to overcompensate for lower electrical resistance by reducing sheet thickness. Typical sheet thicknesses for the alloy according to the invention are in the region of 0.15 mm.

A niobium content of up to 0.15 wt %, and in particular of 0.04 wt % to 0.1 wt %, improves the workability of the alloy, in particular facilitating industrial-scale production since it increases ductility, thereby simplifying both hot rolling and, in particular, cold rolling.

In some embodiments the FeCoV alloy has a polarisation J(16 kA/m)≥2.30 T, preferably ≥2.32 T, preferably ≥2.34 T, and/or a maximum permeability $\mu_{max}$>25,000, preferably ≥30,000, preferably ≥35,000, and/or a coercive field strength Hc≤30 A/m, preferably ≤25 A/m, preferably ≤20 A/m, and/or an electrical resistance of at least 0.15 μΩm.

In some embodiments after heat treatment at a temperature $T_{max}$, where $T_{max}$≤$T(\alpha/\alpha+\gamma)$ and $T_{max}$>900° C., preferably ≥905° C., preferably ≥910° C., preferably ≥920° C., preferably ≥940° C., and the difference ΔT between the phase transition $T(\alpha/\alpha+\gamma)$ and the annealing temperature $T_{max}$ is no more than 20° C., preferably no more than 10° C., the FeCoV alloy has a polarisation J(16 kA/m)≥2.30 T, preferably ≥2.32 T, preferably ≥2.34 T, and/or a maximum permeability $\mu_{max}$>25,000, preferably ≥30,000, preferably ≥35,000, and/or a coercive field strength Hc≤30 A/m, preferably ≤25 A/m, preferably ≤20 A/m, and/or an electrical resistance of at least 0.15 μΩm.

In some embodiments the FeCoV alloy has a polarisation J(16 kA/m)≥2.30 T, preferably ≥2.32 T, preferably ≥2.34 T, a maximum permeability $\mu_{max}$>25,000, preferably ≥30,000, preferably ≥35,000, a coercive field strength Hc≤30 A/m, preferably ≤25 A/m, preferably ≤20 A/m and an electrical resistance of at least 0.15 μΩm.

In some embodiments the FeCoV alloy has an oxide or oxide-containing coating.

In some embodiments the FeCoV alloy takes the form of a strip, sheet or part.

According to the invention a method is also provided for producing a strip from a CoFe alloy comprising the following.

A melt (molten mass) consisting essentially of:
30 wt %≤Co≤55 wt %, preferably 45 wt %≤Co≤55 wt %,
0.4 wt %≤V≤1.5 wt %, preferably 0.6 wt %≤V≤1.35 wt %, preferably 0.8 wt %≤V≤1.2 wt %,
0.0 wt %≤Nb≤0.15 wt %, preferably 0.0 wt %≤Nb≤0.10 wt %, preferably 0.04 wt %≤Nb≤0.10 wt %, 0.0 wt %≤Ta≤0.30 wt %, preferably 0.0 wt %≤Ta≤0.2 wt %, preferably 0.0 wt %≤Ta≤0.15 wt %, 0.00 wt %≤Nb+0.5·Ta≤0.30 wt %, preferably 0.04 wt %≤Nb+0.5·Ta≤0.15 wt %, preferably 0.04 wt %≤Nb+0.5·Ta≤0.10 wt %, max. 0.02 wt % C, preferably max. 0.01 wt %, preferably max. 0.005 wt %, 0.0 wt %≤Si≤0.50 wt %, preferably 0.0 wt %≤Si≤0.30 wt %, 0.0 wt %≤Al≤0.50 wt %, preferably 0.0 wt %≤Al≤0.30 wt %, max. 0.5 wt % Mn, max. 0.5 wt % Cr, max. 0.5 wt % Ni, max. 0.5 wt % W, max. 0.5 wt % Mo, max. 0.5 wt % Zr, the rest iron and up to 1 wt % of other impurities, is provided, wherein the FeCoV alloy has a phase transition from a ferritic α-phase region to a mixed ferritic/austenitic region α+γ that takes place at a transition temperature $T(α/α+γ)$, where $T(α/α+γ)≥900°$ C., preferably ≥905° C., preferably ≥910° C., preferably ≥920° C., preferably ≥940° C.

The molten mass is cast in vacuum and then solidified to form an ingot. The ingot is hot rolled to form a slab and then to form a hot-rolled strip with a thickness $d_1$, followed by the quenching of the hot-rolled strip from a temperature above the temperature of the order-disorder transition $T(α'/α)$ to a temperature of less than 200° C.

After hot rolling, the alloy is customarily cooled to room temperature. The alloy is then heated, in the form of a coil, for example, to a temperature that lies between the order-disorder transition $T(α'/α)$ and the phase transition $T(α/α+γ)$, and then quenched to a temperature of less than 200° C. $T(α'/α)<T(α/α+γ)$.

The quenched hot-rolled strip is cold rolled to form a strip with a thickness $d_2$, where $d_2<d_1$. The strip is then heat treated at a temperature $T_{max}$ for a dwell time t, where $T_{max}≤T(α/α+γ)$ and $T_{max}>900°$ C., preferably ≥905° C., preferably ≥910° C., preferably ≥920° C., preferably ≥940° C.

As the temperature rises, the phase transition between the ferritic α-phase region and the mixed ferritic/austenitic α+γ-region takes place at a first transition temperature $T_{α/α+γ}$ and as the temperature increases further the transition between the mixed ferritic/austenitic α+γ-region and the austenitic γ-phase region takes place at a second transition temperature $T_{α+γ/γ}$.

In some embodiments, after hot rolling, the alloy is quenched from a temperature $T_1$ that lies above the order-disorder transition $T(α'/α)$ and between the order-disorder transition $T(α'/α)$ and the phase transition $T(α/α+γ)$, where $T(α'/α)≤T_1≤T(α/α+γ)$, preferably $T(α'/α)≤T_1≤850°$ C.

The heat treatment at $T_{max}$ is referred to as final annealing because it is carried out on the strip at its final thickness.

The impurities may be one or more elements from the group consisting of O, N, S, P, Ce, Ti, Mg and Be.

A V content of no more than 1.5 wt %, or no more than 1.35 wt %, or no more than 1.2 wt %, permits final annealing in the α-phase region at a higher temperature because phase transition temperature $T(α/α+γ)$ increases as V content falls.

In some embodiments the difference ΔT between phase transition $T(α/α+γ)$ and temperature $T_{max}$ is no more than 20° C., preferably no more than 10° C.

In some embodiments t is at least 0.5 h, preferably at least 4 h, preferably at least 10 h.

In some embodiments the cooling from $T_{max}$ to 700° C. takes place at a rate A of no more than 1000° C./h.

In some embodiments $d_2≤0.35$ mm, preferably ≤0.25 mm, preferably ≤0.15 mm.

In some embodiments $d_1≤0.5$ mm, preferably $d_1≤2.5$ mm, preferably $d_1≤2$ mm.

A small amount of niobium of up to 0.1 wt % or between 0.04 wt % and 0.1 wt %, for example, may be added to the alloy in order to increase ductility. This improves cold rollability and makes it possible to reduce the thickness $d_1$ after hot rolling and quenching by cold rolling to a thickness $d_2$ of less than 0.2 mm, for example.

In some embodiments the strip is coated before heat treatment with a coating based on Mg methylate, Zr propylate or boehmite.

In some embodiments the strip has an oxide or oxide-containing layer after heat treatment.

In some embodiments after hot rolling the hot-rolled strip is quenched from a temperature $T_1$ that lies between an order-disorder transition $T(α'/α)$ and the phase transition $T(α/α+γ)$, where $T(α'/α)≤T_1≤T(α/α+γ)$, preferably $T(α'/α)≤T_1≤850°$ C.

The hot-rolled strip need not be quenched straight from the hot-rolling temperature. It can also be cooled to room temperature after cold rolling, subsequently be heated, for example in the form of a coil, to a temperature $T_1$ that lies between an order-disorder transition $T(α'/α)$ and the phase transition $T(α/α+γ)$ and then be quenched from a temperature above the order-disorder transition $T(α'/α)$, where $T(α'/α)≤T_1≤T(α/α+γ)$, preferably $T(α'/α)≤T_1≤850°$ C.

In some embodiments the quenching of the hot-rolled strip takes the form of quenching from $T_1$ to 100° C. at a cooling rate of at least 500 K/s, preferably at least 1000 K/s, preferably 2000 K/s.

In some embodiments the hot-rolled strip is quenched from $T_1$ to 100° C. in an ice and salt water bath at a cooling rate of at least 500 K/s, preferably at least 1000 K/s, preferably 2000 K/s.

In some embodiments before cold rolling the strip is preheated to a temperature $T_2$, where 20° C.≤$T_2$≤300° C., preferably 30° C.≤$T_2$≤200° C., preferably 50° C.≤$T_2$≤200° C.

In some embodiments a plurality of cold rolling steps is carried out and between cold rolling steps the strip is preheated to a temperature $T_2$, where 20° C.≤$T_2$≤300° C., preferably 30° C.≤$T_2$≤200° C., preferably 50° C.≤$T_2$≤200° C.

BRIEF DESCRIPTION OF THE DRAWINGS

Embodiments and examples are explained in greater detail below with reference to the drawings.

DETAILED DESCRIPTION

In one embodiment an FeCoV alloy is provided with a composition consisting essentially of 30 wt %≤Co≤55 wt %, 0.4 wt %≤V≤1.5 wt %, 0.0 wt %≤Nb≤0.15 wt %, 0.0 wt %≤Ta≤0.30 wt %, 0.00 wt %≤Nb+0.5·Ta≤0.30 wt %, max. 0.02% C, 0.0 wt %≤Si≤0.50 wt %, 0.0 wt %≤Al≤0.50 wt %, max. 0.5% Mn, max. 0.5% Cr, max. 0.5% Ni, max. 0.5% W, max. 0.5% Mo, max. 0.5% Zr, the rest Fe and up to 1 wt % of other impurities.

The FeCoV alloy has a phase transition from a ferritic α-phase region to a mixed ferritic/austenitic α+γ-region to an austenitic γ-phase region. As the temperature rises, the phase transition between the ferritic α-phase region and the mixed ferritic/austenitic α+γ-region takes place at a first transition temperature $T_{\alpha/\alpha+\gamma}$ and as the temperature increases further the transition between the mixed ferritic/austenitic α+γ-region and the austenitic γ-phase region takes place at a second transition temperature $T_{\alpha+\gamma/\gamma}$.

According to the invention the composition is selected so as to increase the first transition temperature such that T(α/α+γ)≥900° C., preferably ≥905° C., preferably ≥910° C., preferably ≥920° C., preferably ≥940° C.

Figure 1:
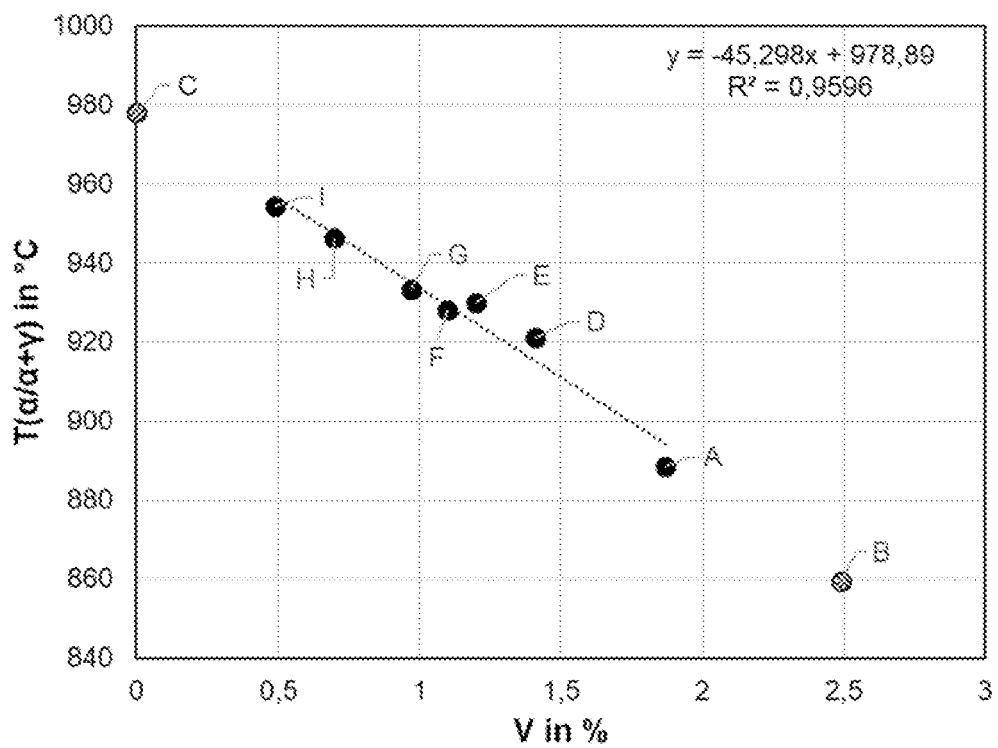
FIG. 1 shows as graph of phase transition α/α+γ as a function of V content.

The increase in phase transition temperature is the result of a reduction in V content to 0.4 wt % to 1.50 wt %. FIG. 1 shows that a reduction in V content by 0.1 wt % results in an increase in phase transition T(α/α+γ) of 4.5° C. The temperature $T_{max}$ at which magnetic final annealing takes place can be increased in equal measure.

This annealing therefore has the following advantages. The higher self-diffusion produced at the higher temperature results in stronger grain growth with the same annealing time. Grain size dk is therefore higher after final annealing. According Mager's relationship (Hc α 1/dk), this results in lower coercive field strength Hc and, ultimately, also in higher permeability. Furthermore, the reducing effect of the hydrogen is improved. Oxides can therefore be better reduced and impurities that are close to the surface and may be disadvantageous for soft magnetic properties are reduced.

The effect of this surface improvement is of particular significance for thin strips measuring 0.25 mm or thinner, in particular, and leads to an improvement in soft magnetic properties.

Figure 2:
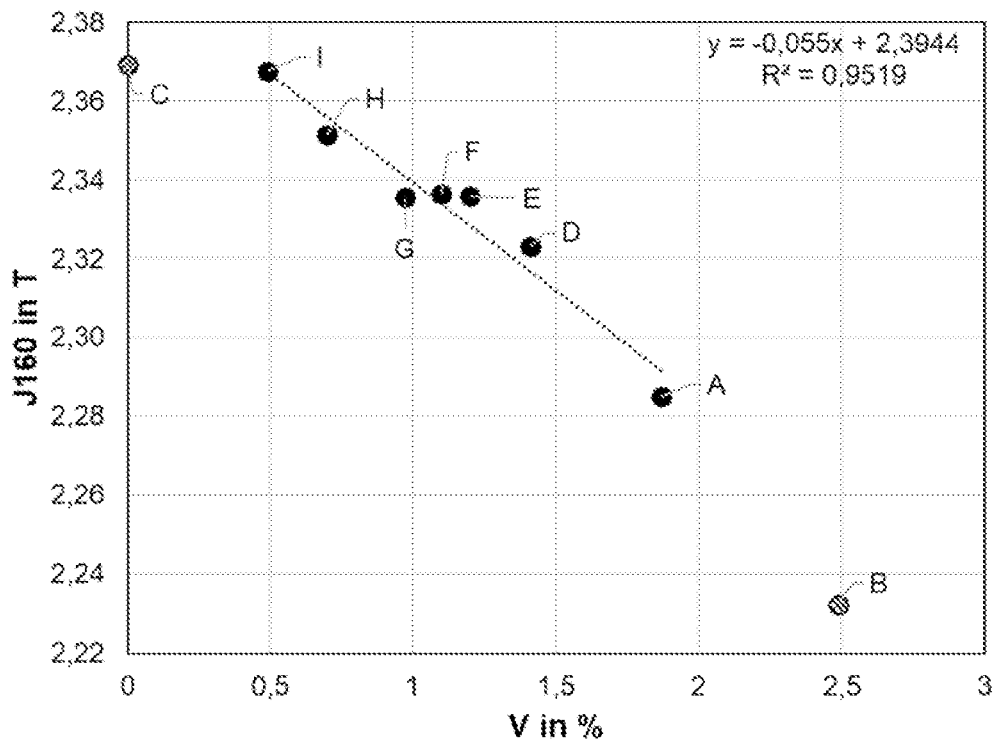
FIG. 2 shows a graph or polarisation J160=J(16 kA/m) as a function of V content.

In a further positive effect, a reduction in V content leads to an increase in saturation polarisation, cf. FIG. 2. With V contents of between 0.4 wt % and 1.5 wt % it is possible to achieve saturation values J160 of up to 2.37 T.

Figure 3:
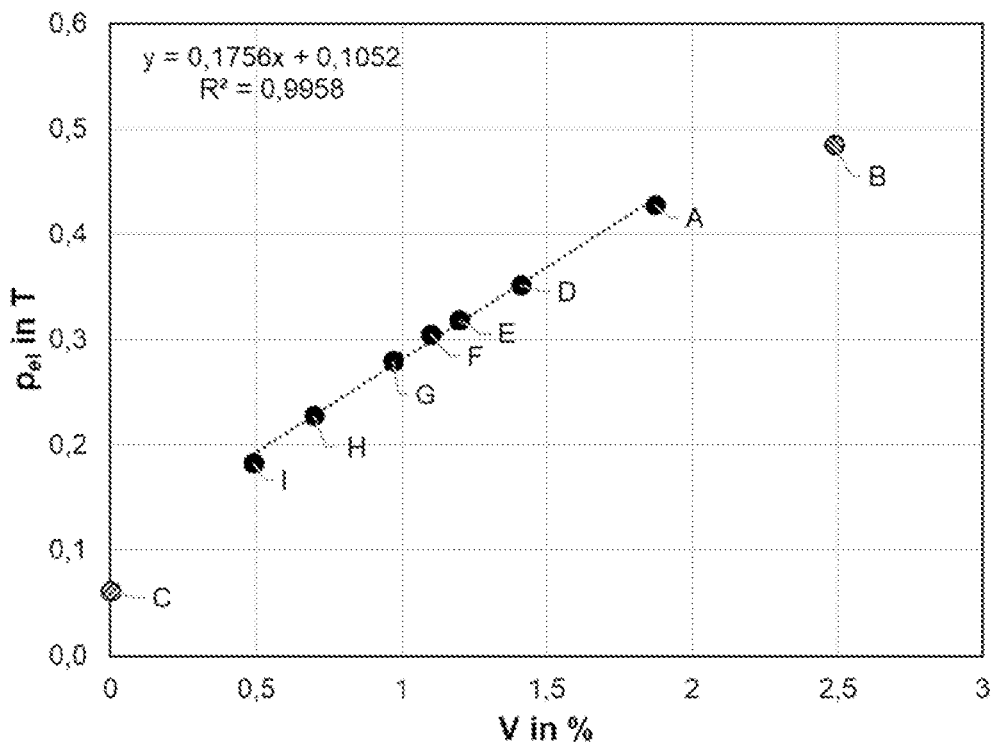
FIG. 3 shows a graph of electrical resistance in the annealed state as a function of V content.

Reduced V content results in lower electrical resistance compared to VACODUR 49, cf. FIG. 3. Depending on the sheet thickness and application, this may lead to increased eddy-current losses. However, as electrical resistance has a purely linear effect on eddy-current losses, while sheet thickness has a quadratic effect, it is possible to overcompensate for lower electrical resistance by reducing sheet thickness. Typical sheet thicknesses for the alloy according to the invention are in the region of 0.15 mm.

The alloy is typically provided as a preliminary product in the form of a strip, sheet or part that is heat treated. This heat treatment may be referred to as final annealing because it is carried out as far downstream in the manufacturing process as possible, preferably after the last forming step.

The composition of the FeCoV alloy is defined in greater detail in further embodiments. The FeCoV alloy may have a composition consisting essentially of:

30 wt %≤Co≤55 wt %, preferably 45 wt %≤Co≤55 wt %, 0.4 wt %≤V≤1.5 wt %, preferably 0.6 wt %≤V≤1.35 wt %, preferably 0.8 wt %≤V≤1.2 wt %, 0.0 wt %≤Nb≤0.15 wt %, preferably 0.0 wt %<Nb≤0.10 wt %, preferably 0.04 wt %≤Nb≤0.10 wt %, 0.0 wt %≤Ta≤0.30 wt %, preferably 0.0 wt %≤Ta≤0.2 wt %, preferably 0.0 wt %≤Ta≤0.15 wt %, 0.00 wt %≤Nb+0.5·Ta≤0.30 wt %, preferably 0.04 wt %≤Nb+0.5·Ta≤0.15 wt %, preferably 0.04 wt %≤Nb+0.5·Ta≤0.10 wt %, max. 0.02 wt % C, preferably max. 0.01 wt %, preferably max. 0.005 wt %, 0.0 wt %≤Si≤0.50 wt %, preferably 0.0 wt %≤Si≤0.30 wt %, 0.0 wt %≤Al≤0.50 wt %, preferably 0.0 wt %≤Al≤0.30 wt %, max. 0.5 wt % Mn, max. 0.5 wt % Cr, max. 0.5 wt % Ni, max. 0.5 wt % W, max. 0.5 wt % Mo, max. 0.5 wt % Zr, the rest iron and up to 1 wt % of other impurities.

The impurities may contain one or more of the elements from the group consisting of O, N, S, P, Ce, Ti, Mg and Be.

It has been found that composition (in particular Co, V and Nb contents), transition temperature T(α/α+γ) and the performance of heat treatment at a temperature $T_{max}$ greater than 900° C. have a major influence on improved magnetic properties.

Compared to compositions without V (i.e. containing only Nb and/or Ta), the alloy according to the invention has an electrical resistance of at least 0.15 μΩm after heat treatment.

The heat treatment can be carried out using an annealing-resistant coating that is present after annealing as an oxidic or oxide or oxide-containing coating such as the Mg-methlyate-based DL1, the Zr-propylate-based HITCOAT or a boehmite-based coating, for example.

Some features of the production route according to the invention for the production of the alloy according to the invention are:

a hot rolling thickness $d_1$ with $d_1 \leq 3.5$ mm, preferably $d_1 \leq 2.5$ mm, preferably $d_1 \leq 2$ mm, quenching from a temperature $T_1$ that lies between the order-disorder transition T(α'/α) and the phase transition T(α/α+γ), i.e. T(α'/α)≤$T_1$≤T(α/α+γ), preferably $T_1$≤850° C., it being possible to carry out the quenching in a separate process step after the hot-rolled strip has been cooled to room temperature and then heated to $T_1$, quenching from $T_1$ to 100° C. in an ice salt water bath at a cooling rate of at least 500 K/s, preferably at least 1000 K/s, 2000 K/s, pre-heating to a temperature $T_2$ before rolling, where 20° C.≤$T_2$≤300° C., preferably 30° C.≤$T_2$≤200° C., preferably 50° C.≤$T_2$≤200° C.

The combination of as many of these features as possible is useful in achieving cold workability. The cooling rate specified is achieved when a mixture of ice and salt water is used.

Table 1 gives the compositions of nine different FeCo-based melts labeled A to I. The data on the concentration of the elements Co, V, Nb and Mn are given in percentage by weight; the data on C, S, O and N are given in ppm by weight. The contents of residual impurities Ti, Zr, Ta, P, Cu, Mo and Cr not given in the table were all below 0.01 wt % and the Al content was below 0.005 wt %. The Co/Fe ratio was calculated from their respective percentages by weight without taking the contents of impurities C, S, N or O into account in the calculation.

TABLE 1

| | R/Inv | Fe | Co % | V % | Nb % | Mn % | C ppm | S ppm | O ppm | N ppm | T($\alpha'/\alpha$) °C | T($\alpha/\alpha + \gamma$) °C | $\rho_{el}$ $\mu\Omega$cm | Batch | Co/Fe |
|---|---|---|---|---|---|---|---|---|---|---|---|---|---|---|---|
| A | R | Rest | 48.70 | 1.87 | 0.09 | 0.17 | 27 | 10 | 60 | 8 | 717 | 889 | 42.8 | 93/0579 | 0.990 |
| B | R | Rest | 48.60 | 2.49 | 0.09 | 0.17 | 40 | 10 | 20 | 7 | 711 | 830 | 48.6 | 93/0578 | 0.999 |
| C | R | Rest | 49.00 | 0.00 | 0.30 | <0.01 | 19 | 8 | 65 | 5 | 735 | 978 | 6.1 | 93/0445 | 0.966 |
| D | Inv | Rest | 48.65 | 1.41 | 0.10 | 0.21 | <10 | 10 | 20 | 10 | 718 | 921 | 35.2 | 93/0768 | 0.980 |
| E | Inv | Rest | 48.55 | 1.20 | 0.10 | 0.21 | 10 | 10 | 10 | <10 | 720 | 930 | 31.8 | 93/0767 | 0.972 |
| F | Inv | Rest | 48.95 | 1.10 | 0.10 | 0.21 | <10 | 10 | 90 | 10 | 722 | 928 | 30.6 | 93/0766 | 0.986 |
| G | Inv | Rest | 48.55 | 0.97 | 0.10 | 0.17 | 26 | 9 | 48 | 7 | 726 | 933 | 28.0 | 93/0581 | 0.967 |
| H | Inv | Rest | 48.55 | 0.70 | 0.10 | 0.18 | 23 | 9 | 55 | 7 | 730 | 946 | 22.8 | 93/0582 | 0.962 |
| I | Inv | Rest | 48.50 | 0.49 | 0.08 | 0.17 | 24 | 9 | 61 | 7 | 732 | 954 | 18.4 | 93/0583 | 0.955 |
| J | Inv | Rest | 48.5 | 0.95 | 0.09 | — | 29 | 10 | 40 | 10 | 720 | 945 | 27.2 | 93/0794 | 0.961 |
| K | Inv | Rest | 49.3 | 0.97 | — | 0.06 | 46 | 8 | 63 | 8 | 718 | 940 | 27.0 | 93/0799 | 0.993 |
| L | Inv | Rest | 49.3 | 0.99 | 0.06 | 0.06 | 31 | 8 | 76 | 8 | 717 | 935 | 28.0 | 93/0800 | 0.994 |
| M | Inv | Rest | 49.3 | 0.99 | 0.09 | 0.06 | 27 | 7 | 89 | 8 | 717 | 937 | 28.4 | 93/0801 | 0.995 |
| N | Inv | Rest | 49.2 | 0.97 | 0.09 | 0.37 | 25 | 9 | 85 | 7 | 725 | 923 | 27.9 | 93/0807 | 0.997 |
| O | Inv | Rest | 49.1 | 1.20 | 0.05 | 0.22 | 21 | 10 | 59 | 7 | 719 | 921 | 31.9 | 93/0817 | 0.993 |
| P | Inv | Rest | 49.2 | 1.40 | 0.05 | 0.21 | 18 | 10 | 48 | 7 | 716 | 915 | 34.7 | 93/0819 | 1.001 |
| Q | R | Rest | 49.3 | 0.97 | 0.19 | 0.06 | 28 | 9 | 68 | 7 | 719 | 931 | 28.5 | 93/0806 | 0.996 |
| R | Inv | Rest | 45.10 | 1.00 | 0.10 | 0.19 | 26 | 8 | 63 | 5 | 714 | 945 | 26.7 | 93/0848 | 0.842 |
| S | Inv | Rest | 47.15 | 0.99 | 0.10 | 0.20 | 18 | 9 | 67 | 5 | 718 | 938 | 27.7 | 93/0849 | 0.915 |
| T | Inv | Rest | 47.60 | 1.00 | 0.10 | 0.21 | 27 | 9 | 56 | 5 | 719 | 940 | 27.8 | 93/0850 | 0.932 |
| U | Inv | Rest | 48.10 | 1.00 | 0.10 | 0.21 | 20 | 9 | 76 | 5 | 719 | 935 | 28.2 | 93/0851 | 0.952 |
| V | Inv | Rest | 49.80 | 0.95 | 0.09 | 0.06 | 23 | 9 | 56 | 8 | 719 | 934 | 27.8 | 93/0805 | 1.014 |

Table 1 shows the composition (as weight percent or ppm (parts per million)), the position of the phase transitions and the electrical resistance in the annealed state of the examples according to the invention (Inv) and the references (R).

T($\alpha'/\alpha$) indicates the transition from the ordered ferritic phase ($\alpha'$) to the disordered ferritic phase ($\alpha$). This transition, which is characteristic of FeCo alloys with Co contents of between 30 wt % and 55 wt %, is dependent on composition and typically above 700° C. The exact position of this transition is important for the manufacture of strip material, for example, because the quenching that precedes cold rolling should take place from a temperature above this transition.

Temperature T($\alpha/\alpha+\gamma$) indicates the transition from the ferritic region ($\alpha$) to the mixed ferritic/austenitic region ($\alpha+\gamma$). This transition is also dependent on composition. In an FeCoV system annealing above this phase transition is typically associated with a significant deterioration in soft magnetic properties.

These phase transitions can be determined using thermal methods such as dilatometry or differential scanning calorimetry (DSC). Depending on the method and parameters chosen, the phase transitions thus determined may vary from one another by a few degrees Celsius. The phase transitions for the compositions described here were determined by means of DSC, the peak of the corresponding signal during heating being used for the transition T($\alpha'/\alpha$) and the first onset during cooling being used for T($\alpha/\alpha+\gamma$).

Electrical resistance $\rho_{el}$ was measured in the annealed state with annealing taking place in the ferritic $\alpha$-region. The annealing temperature was 880° C. with the exception of composition B for which an annealing temperature of 850° C. was selected.

Embodiments A, B and C are references, examples D to I states according to the invention.

Composition A has 48.7 wt % Co, 1.87% V, 0.09% Nb, 0.17 wt % Mn and the rest Fe and therefore corresponds substantially to the composition disclosed in GB2495465B. This alloy is commercially available under the name VACO-DUR 49. The phase transition T($\alpha/\alpha+\gamma$) is 889° C., the order-disorder transition T($\alpha'/\alpha$) 717° C. Electrical resistance is 42.8 $\mu\Omega$cm, i.e. above 40 $\mu\Omega$cm.

In composition B the V content was increased to 2.49 wt % with the same contents of Co, Nb and Mn. This is associated with a clear reduction in phase transition T($\alpha/\alpha+\gamma$) to 830° C. and an increase in electrical resistance to 48.6 $\mu\Omega$cm.

Composition C corresponds to a variant without V. Since a purely binary FeCo alloy cannot be cold rolled, adequate ductility was ensured by 0.30 wt % Nb. Due to the complete absence of V, the phase transition T($\alpha/\alpha+\gamma$) of this alloy is relatively high at 978° C. At the same time, the order-disorder transition T($\alpha'/\alpha$) increases to 735° C. Owing to the complete lack of V, electrical resistance is 6.1 $\mu\Omega$cm, the same as for a binary FeCo alloy, i.e. very low.

Variant D corresponds to example A according to the invention with a V content reduced to 1.4 wt %. This reduction in V content increases already reduces the phase transition T($\alpha/\alpha+\gamma$) to 921° C. Electrical resistance in turn drops to 35.2 $\mu\Omega$cm.

Compositions E, F, G, H and I according to the invention have Co contents of between 48.5 wt % and 49 wt % and Nb contents of between 0.08 wt % and 0.10 wt %. The V content varies from 1.20 wt % in example E up to 0.49 wt % in example I. The Mn content is similar in all compositions at approx. 0.2 wt %. In a large molten mass these Mn additions may be significantly smaller. Phase transition T($\alpha/\alpha+\gamma$) lies between 928° C. and 954° C. and increases as V content decreases, while electrical resistance falls to 18.4 $\mu\Omega$cm.

It is, in principle, possible to vary the compositions according to the invention further. In further embodiments small additions of various elements are made to increase electrical resistances. In one example Mo, W, Cr and Mn are added in quantities of up to 0.5 wt % and Si and Al are added in quantities of up to 0.3 wt %. These additions are always calculated to ensure that the temperature of the phase transition T($\alpha/\alpha+\gamma$) is not pushed below 900° C.

Hold and Cold Forming

Ingots with the specified compositions were melted by means of vacuum induction melting (VIM), surface milled and then hot rolled at loading temperatures of between 1000° C. and 1200° C. to a thickness of 1.5 mm to 3.5 mm, preferably less than 2.5 mm or less than 2.0 mm.

After hot rolling the strip is in an ordered to partially ordered state in which it lacks adequate cold rollability. In the next step, after annealing at $T_1=820°$ C. for a period of ≤1 h, the hot rolled strips are therefore quenched by rapid dipping in a mixture of ice and salt water in order to the suppress the ordering and permit further cold forming.

The quenching temperature $T_1$ should be above the order-disorder transition $T(\alpha'/\alpha)$ to ensure that the order is suppressed during annealing and that this state is maintained for as long as possible by quenching. For industrial-scale strip manufacture the $T_1$ selected should be sufficiently high to ensure that sufficient time remains in which to dip the strip in the quenching bath. At 820° C., the quenching temperature selected in these examples was sufficiently high to ensure that this was achieved for all samples.

On the other hand, however, $T_1$ should low enough to ensure that grain growth is low because coarse grains have a negative effect on cold workability. To avoid grain growth the dwell time at quenching temperature can be limited, in this example to 1 h. In industrial-scale manufacture, however, it may be necessary to keep the strip at temperature for several hours in order to ensure even heating of the entire strip. It may, therefore, also be expedient to reduce grain growth by the addition of Nb and/or Ta. In some embodiments Nb contents of approx. 0.1 wt % were chosen. A niobium content of between 0.04 wt % and 0.1 wt % was found to be advantageous. Alternatively, Ta for example can be used, though here approximately twice the amount has to be used owning to its higher atomic weight.

The remaining quenching parameters such as salt concentration, water quantity in relation to the sample and the amount of ice for cooling, for example, were chosen to ensure quenching rates of 1000° C./h or more in a temperature range of up to at least 100° C. Observing these high quenching rates leads to the successful suppression of ordering.

Through the combination of the measures described ordering was very largely suppressed, resulting in a fine-grained structure. In this way it was possible to adequately ductilise all the compositions, including those with a low V content, and thus ensure that further forming was possible.

The hot-rolling skin of the quenched strips was removed by stripping or sandblasting. Loose oxides on larger-scale strips can also be removed by means of shot blasting, for example.

The strips were then cold rolled. While cold rolling in reference state A was completely successful at 1.89 wt %, cracks formed in strips with a V content of under 1.4 wt %, in particular. It is known that the addition of V to FeCo leads to an improvement in ductility after quenching. Commercial alloys therefore have V contents of between 1.8 wt % and 2.0 wt % in order to ensure adequate workability.

Two possible ways of significantly reducing this crack formation and ensuring cold rollability despite a reduced V content of below 1.5 wt % were identified.

Preheating the strip before cold rolling to a temperature of up to 300° C., preferably at least 30° C. and no more than 200° C., preferably at least 50° C. and no more than 200° C. The heating reduces the yield limit, and the material becomes easier to form plastically. However, heating the strip to above 200° C. results in the gradual embrittlement of the strip. The preheating temperature should therefore be no higher than necessary and heating should be restricted to the time necessary to heat the strip through completely.

In addition, the smallest possible hot-rolling thickness proved to be extremely advantageous for strips with 1.4 wt % V or a lower V content, e.g. between 0.6 wt % and 1.35 wt % or between 0.8 wt % and 1.2 wt %, since this made continuous forming in the first cold-rolling pass possible. Specifically, strips with a cold-rolling thickness of 1.8 mm were significantly easier to form than strips with a cold-rolling thickness of 3.5 mm. In industrial-scale manufacture a cold-rolling thickness of less than 2.5 mm, better still less than 2.0 mm, should be sought.

After approx. 20% cold forming all the strips could be worked further without difficulty. The strips were cold rolled in a plurality of passes to a final thickness of approx. 0.35 mm or 0.15 mm. It is also possible to integrate grinding and stripping steps into the manufacturing process in order to further improve surface quality.

Annealing and Magnetic Characteristics

Sample rings measuring Ø28.5 mm×Ø20.0 mm were punched out of the cold-rolled strips. The rings thus obtained underwent various magnetic final annealing processes and were magnetically characterised in accordance with standard IEC 60404-4 or IEC 60404-6.

Table 2 provides an overview of the magnetic values for samples of compositions A to I with various final annealing processes. The annealing processes were numbered consecutively in line with the corresponding composition, e.g. A1 and A2 for composition A. The R/Inv column indicates, on one hand, whether the composition of the alloy is that disclosed in the invention and whether the annealing process used is that disclosed in the invention (Inv) and, on the other, if neither of these conditions is fulfilled, that the value is a reference value (R).

All annealing processes took place in dry hydrogen at a dwell temperature $T_{max}$ and for a dwell period dwell period t. Cooling from $T_{max}$ to approx. 400° C. took place at a rate of 100° C./h to 200° C./h. The cooling rate can also be varied, although cooling rates of over 1000° C./h are not recommended since they can cause stresses in the material that result in a reduction in permeability.

Annealing was carried out for each composition at a dwell temperature of 880° C. as this level of annealing temperature corresponds to the typical recommended value. In addition, at least one second annealing process was carried out at a different annealing temperature. The dwell time was 4 or 6 h and as long as 12 h in individual cases. In some cases some samples were annealed noch at a thickness of 0.15 mm.

The magnetic parameters obtained are coercive field strength Hc, remanence Br, maximum permeability $\mu_{max}$, induction values B(H) with B3, B8, B24, B80 and B160 at field strengths of H=3 A/cm, 8 A/cm, 24 A/cm, 80 A/cm and 160 A/cm and polarisation J160 at H=160 A/cm, calculated from B160, which can be regarded as a good approximation for the achievable saturation polarisation. A sample that is good in terms of the invention has low coercive field strength Hc, high maximum permeability $\mu_{max}$, high inductions B(H) and the highest possible saturation J160.

For reference sample A with the composition of the commercial alloy VACODUR 49 a typical manufacturer recommended maximum final annealing temperature of 880° C. is used. As can be seen in A1, relatively good soft magnetic properties can already be obtained here, i.e. a Hc of 31.6 A/m and a permeability 22,971. Owing to the V content of almost 1.9 wt %, saturation J160 is below 2.3 T. If the final annealing temperature is increased to 890° C., as in example A2, annealing takes place at the lower end of the two-phase region α+γ since the DSC results shows a transition temperature $T(\alpha/\alpha+\gamma)$ of 889° C. This results in a significant deterioration in magnetic properties, i.e. an increase in Hc to 53 A/m and a drop in $\mu_{max}$ to 6,499. It is assumed that this is attributable to demixing during annealing since there is a slightly increased concentration of V at the grain boundaries. The example shows that exceeding the phase transition is not expedient for FeCoV alloys.

With sample B the annealing temperature of 880° C. selected in annealing process B1 is already in the mixed α+γ-region. Coercive field strength is correspondingly high at 220 A/m. For sample B2 an improved annealing process at 830° C., is used which is still in the α-region for the composition. However, at 55.7 A/m the Hc is significantly higher than the comparison A1. The annealing process according to the invention cannot therefore be used with this composition because the phase transition T(α/α+γ) is below 900° C.

In example C1, the V-free variant C continues to exhibit a very high Hc value of 107 A/m after annealing at 880° C. Owing to the high temperature of the α/α+γ transition, annealing is possible at a significantly higher annealing temperature of up to 970° C., though with Hc at 56.9 A/m and $\mu_{max}$ at 11,034, the parameters are nevertheless worse than for reference annealing A1.

Example C shows that merely increasing the annealing temperature to above 900° C. does not necessarily lead to an improvement in soft magnetic properties. An appropriate composition should also be used to improve soft magnetic properties.

In example D1 with standard annealing at 880° C. composition D 1.4% with 1.4 wt % V according to the invention achieves almost identical values to the comparison A1 with 1.9 wt % V. Saturation J160 is already above 2.31 T due to the reduced amount of vanadium added. A higher annealing temperature above 900° C. is also possible here due to the increased phase transition. Example D2 demonstrates that annealing at 910° C. for the same annealing time resulted in an improvement in parameters.

In example E1 with annealing at 880° C. composition E according to the invention with 1.2 wt % V still produces magnetic parameters that correspond to those of reference A1, e.g. a Hc of 31.7 A/m. However, saturation J160 is significantly higher at over 2.33 T due to the reduced V content. The phase transition α/α+γ at 930° C. means that annealing is possible at a significantly higher temperature than with composition A. In example E2 a significantly reduced coercive field strength Hc of 27.1 A/m is achieved at a dwell temperature of 920° C. With this V content the possible annealing temperature has already been increased to such an extent that a significant advantage is achieved.

Like E2, annealing E3 was carried out at a dwell temperature of 920° C. but for an extended dwell time of 12 h. This dwell period, which remains acceptable for series production, once again results in a further substantial improvement, in particular in terms of coercive field strength, which drops to 22.9 A/m.

Composition F with 1.1 wt % V results in a similar effect for both the F1 annealing at 880° C. and the F2 annealing at 920° C., i.e. the increase in annealing temperature means that Hc can be reduced significantly and $\mu_{max}$ can be increased significantly. In annealing example F3 the longer dwell time of 12 h results in a very low Hc of only 21.5 A/m.

The four annealing processes of variant G with 0.97 wt % V show, firstly, the effect of the increase in annealing temperature, i.e. G2 is better than G1, and G4 is better than G3. In addition, the positive effect of stronger cold forming is also clear, i.e. the 0.15 mm-thick sample G4 responds better to annealing at a higher temperature, resulting in a very good Hc value of only 16.2 A/m and a maximum permeability of 32,596.

With composition H this effect is even more considerable. In embodiments H2 and H4, increasing the annealing temperature to 940° C. in combination with the low V content of only 0.70 wt % results in coercive field strengths Hc of below 20 A/m and a maximum permeability of over 39,000. At the same time, saturation J160 is approx. 2.35 T. Sample H2 was first annealed for 6 hours at 880° C. before annealing according to the invention at 940° C. The results show no substantial advantage over sample I4, which was annealed at 940° C. It is, therefore, the increase in annealing temperature rather than repeated annealing of the sample that is effective here.

The effect of the higher annealing temperature is also clearly visible with composition I according to the invention, which has the lowest V content at 0.49 wt %, i.e. while reference annealing I1 at 880° C. achieves a maximum permeability of only 24,666, the sample annealed at 950° C. achieves a significantly higher permeability of 33,269.

Examples I3 and I4 show that even with a very low V content annealing above phase transition T(α/α+γ) is not expedient. The phase transition measured is 954° C. and annealing at 960° C. already results in an increase in Hc to 40.3 A/m. Annealing at 1050° C., completely within the austenitic α-region, leads to a deterioration in Hc to 59.6 A/m.

TABLE 2

| | R/Inv | d mm | Tmax °C. | t h | Hc A/m | Br T | $\mu_{max}$ | B1 T | B3 T | B8 T | B24 T | B80 T | B160 T | J160 T | Sample |
|---|---|---|---|---|---|---|---|---|---|---|---|---|---|---|---|
| A1 | R | 0.35 | 880 | 6 | 31.6 | 1.50 | 22,971 | 1.791 | 2.044 | 2.177 | 2.254 | 2.285 | 2.305 | 2.285 | 1802188 |
| A2 | R | 0.35 | 890 | 6 | 53.0 | 0.79 | 6,499 | 0.771 | 1.267 | 1.670 | 2.020 | 2.216 | 2.270 | 2.249 | 1905377 |
| B1 | R | 0.35 | 880 | 6 | 220.0 | 0.63 | 1,212 | | 0.452 | 0.877 | 1.388 | 1.884 | 0.877 | 2.057 | 1802187 |
| B2 | R | 0.35 | 830 | 6 | 55.7 | 1.34 | 11,734 | | 1.878 | 2.088 | 2.199 | 2.248 | 2.265 | 2.245 | 1802203 |
| C1 | R | 0.35 | 880 | 6 | 107.0 | 1.63 | 8,502 | | 1.918 | 2.173 | 2.310 | 2.370 | 2.390 | 2.369 | 2001897 |
| C2 | R | 0.35 | 970 | 4 | 56.9 | 1.38 | 11,034 | | 1.940 | 2.167 | 2.315 | 2.375 | 2.392 | 2.371 | 1900141 |
| D1 | R | 0.35 | 880 | 6 | 32.6 | 1.68 | 23,733 | | 2.092 | 2.231 | 2.298 | 2.328 | 2.343 | 2.323 | 2002581 |
| D2 | Inv | 0.35 | 910 | 6 | 28.1 | 1.65 | 25,071 | 1.873 | 2.126 | 2.251 | 2.305 | 2.328 | 2.342 | 2.322 | 2002593 |
| E1 | R | 0.35 | 880 | 6 | 31.7 | 1.64 | 23,016 | | 2.085 | 2.242 | 2.311 | 2.341 | 2.356 | 2.336 | 2002580 |
| E2 | Inv | 0.35 | 920 | 6 | 27.1 | 1.67 | 25,326 | 1.853 | 2.124 | 2.261 | 2.317 | 2.341 | 2.354 | 2.334 | 2002588 |
| E3 | Inv | 0.35 | 920 | 12 | 22.9 | 1.61 | 27,498 | 1.843 | 2.129 | 2.269 | 2.318 | 2.340 | 2.353 | 2.333 | 2002592 |
| F1 | R | 0.35 | 880 | 6 | 29.0 | 1.74 | 26,317 | | 2.114 | 2.235 | 2.309 | 2.341 | 2.357 | 2.336 | 2002579 |
| F2 | Inv | 0.35 | 920 | 6 | 26.2 | 1.81 | 31,589 | 1.966 | 2.142 | 2.251 | 2.317 | 2.343 | 2.357 | 2.337 | 2002587 |
| F3 | Inv | 0.35 | 920 | 12 | 21.5 | 1.79 | 37,110 | 1.988 | 2.157 | 2.260 | 2.319 | 2.343 | 2.356 | 2.336 | 2002591 |
| G1 | R | 0.35 | 880 | 6 | 28.7 | 1.57 | 23,948 | | 2.057 | 2.243 | 2.316 | 2.344 | 2.356 | 2.336 | 1802190 |
| G2 | Inv | 0.35 | 925 | 6 | 24.7 | 1.56 | 26,514 | 1.757 | 2.069 | 2.249 | 2.323 | 2.351 | 2.364 | 2.344 | 1804102 |
| G3 | R | 0.15 | 880 | 6 | 28.2 | 1.49 | 21,351 | | 1.897 | 2.117 | 2.251 | 2.316 | 2.337 | 2.317 | 1900151 |
| G4 | Inv | 0.15 | 925 | 6 | 16.3 | 1.62 | 32,596 | 1.767 | 2.006 | 2.222 | 2.310 | 2.335 | 2.347 | 2.327 | 1905349 |
| H1 | R | 0.35 | 880 | 6 | 27.9 | 1.52 | 23,102 | | 1.995 | 2.231 | 2.321 | 2.351 | 2.372 | 2.352 | 1802191 |

TABLE 2-continued

| | R/Inv | d mm | Tmax °C. | t h | Hc A/m | Br T | $\mu_{max}$ | B1 T | B3 T | B8 T | B24 T | B80 T | B160 T | J160 T | Sample |
|---|---|---|---|---|---|---|---|---|---|---|---|---|---|---|---|
| H2 | Inv | 0.35 | 940 | 4 | 19.9 | 1.62 | 39,580 | 1.797 | 2.073 | 2.278 | 2.337 | 2.357 | 2.368 | 2.348 | 1802191 |
| H3 | R | 0.15 | 880 | 6 | 27.0 | 1.57 | 24,392 | | 1.972 | 2.187 | 2.302 | 2.348 | 2.364 | 2.344 | 1900152 |
| H4 | Inv | 0.15 | 940 | 6 | 16.2 | 1.68 | 39,479 | 1.790 | 2.009 | 2.236 | 2.330 | 2.354 | 2.368 | 2.348 | 1905347 |
| I1 | R | 0.35 | 880 | 6 | 28.5 | 1.58 | 24,666 | | 2.006 | 2.254 | 2.343 | 2.374 | 2.388 | 2.368 | 1802192 |
| I2 | Inv | 0.35 | 950 | 4 | 18.3 | 1.64 | 33,269 | 1.807 | 2.061 | 2.278 | 2.344 | 2.366 | 2.381 | 2.361 | 1802206 |
| I3 | R | 0.15 | 960 | 6 | 40.3 | 1.69 | 22,903 | | 1.993 | 2.219 | 2.327 | 2.363 | 2.377 | 2.356 | 1905381 |
| I4 | R | 0.35 | 1050 | 6 | 59.6 | 1.47 | 10,606 | | 1.831 | 2.148 | 2.303 | 2.346 | 2.389 | 2.369 | 1701536 |
| J1 | Inv | 0.35 | 935 | 6 | 20.8 | 1.59 | 30,135 | 1.765 | 2.069 | 2.277 | 2.336 | 2.356 | 2.369 | 2.349 | 2100285 |
| J2 | Inv | 0.10 | 935 | 6 | 17.3 | 1.66 | 39,310 | 1.831 | 2.075 | 2.256 | 2.327 | 2.356 | 2.371 | 2.351 | 2100286 |
| K1 | Inv | 0.35 | 925 | 6 | 21.6 | 1.67 | 36,720 | 1.948 | 2.144 | 2.272 | 2.333 | 2.357 | 2.370 | 2.350 | 2100311 |
| K2 | Inv | 0.10 | 925 | 6 | 20.3 | 1.55 | 31,025 | 1.756 | 2.037 | 2.221 | 2.323 | 2.359 | 2.374 | 2.354 | 2100319 |
| L1 | Inv | 0.35 | 920 | 6 | 22.9 | 1.81 | 34,640 | 1.942 | 2.120 | 2.246 | 2.323 | 2.351 | 2.362 | 2.342 | 2100308 |
| L2 | Inv | 0.10 | 920 | 6 | 24.1 | 1.67 | 32,980 | 1.804 | 2.042 | 2.203 | 2.312 | 2.351 | 2.364 | 2.344 | 2100317 |
| M1 | Inv | 0.35 | 920 | 6 | 26.9 | 1.78 | 29,219 | 1.920 | 2.113 | 2.238 | 2.316 | 2.346 | 2.361 | 2.341 | 2100307 |
| M2 | Inv | 0.10 | 920 | 6 | 27.6 | 1.65 | 28,286 | 1.770 | 2.022 | 2.189 | 2.301 | 2.345 | 2.361 | 2.341 | 2100318 |
| N1 | Inv | 0.35 | 915 | 6 | 28.6 | 1.81 | 28,709 | 1.931 | 2.116 | 2.238 | 2.316 | 2.348 | 2.362 | 2.342 | 2102028 |
| N2 | Inv | 0.10 | 915 | 6 | 29.5 | 1.86 | 29,435 | 1.965 | 2.146 | 2.252 | 2.321 | 2.351 | 2.366 | 2.346 | 2102030 |
| O1 | Inv | 0.35 | 915 | 6 | 28.0 | 1.63 | 25,894 | 1.893 | 2.105 | 2.229 | 2.305 | 2.335 | 2.351 | 2.331 | 2102050 |
| O2 | Inv | 0.10 | 915 | 6 | 24.9 | 1.70 | 31,131 | 1.902 | 2.120 | 2.242 | 2.312 | 2.339 | 2.353 | 2.333 | 2102052 |
| P1 | Inv | 0.35 | 910 | 6 | 23.4 | 1.70 | 33,200 | 1.964 | 2.138 | 2.244 | 2.304 | 2.328 | 2.341 | 2.321 | 2101973 |
| P2 | Inv | 0.10 | 910 | 6 | 23.6 | 1.64 | 31,790 | 1.840 | 2.060 | 2.199 | 2.291 | 2.328 | 2.344 | 2.324 | 2102047 |
| Q1 | R | 0.35 | 925 | 6 | 49.8 | 1.53 | 14,149 | 1.623 | 1.998 | 2.174 | 2.293 | 2.339 | 2.356 | 2.336 | 2102018 |
| R1 | Inv | 0.35 | 920 | 6 | 32.0 | 1.49 | 18,300 | 1.374 | 1.622 | 1.861 | 2.185 | 2.360 | 2.368 | 2.348 | 2106020 |
| S1 | Inv | 0.35 | 920 | 6 | 27.9 | 1.49 | 23,027 | 1.435 | 1.690 | 1.968 | 2.305 | 2.355 | 2.361 | 2.341 | 2106019 |
| T1 | Inv | 0.35 | 920 | 6 | 27.8 | 1.50 | 24,787 | 1.487 | 1.757 | 2.053 | 2.325 | 2.354 | 2.359 | 2.339 | 2106021 |
| U1 | Inv | 0.35 | 920 | 6 | 26.3 | 1.53 | 26,969 | 1.569 | 1.860 | 2.166 | 2.331 | 2.353 | 2.358 | 2.338 | 2106018 |
| V1 | Inv | 0.35 | 925 | 6 | 36.3 | 0.87 | 14,674 | 1.606 | 1.929 | 2.125 | 2.278 | 2.339 | 2.359 | 2.339 | 2102016 |

Table 2 shows the static parameters as a function of annealing at annealing temperatures according to the invention (Inv) and reference annealing (R).

In addition to the static parameters, the magnetisation losses between 50 Hz and 1000 Hz were also considered. Losses at low frequencies such as 50 Hz, for example, are substantially determined by hysteresis losses $P_H$. Owing to the relationship $$P_H \propto H_c$$

a low coercive field strength Hc is necessary to achieve low losses. At high frequencies such as 1 kHz, for example, losses are determined principally by eddy-current losses $P_{eddy}$. These are proportional to the square of the strip thickness d and inversely proportional to electrical resistance $\rho_{el}$:

$$P_{eddy} \propto \frac{d^2}{\rho_{el}}$$

The ratio of strip thickness to the square to electrical resistance is therefore decisive for low losses at high frequencies.

Table 3 gives the magnetisation losses $P_{Fe}$ measured on selected samples for inductions $B_{max}$ of 1.5 T and 2.0 T at frequencies of 50 Hz, 400 Hz and 1000 Hz. Here $P_{Fe}$(2.0 T, 400 Hz) indicates the losses $P_{Fe}$ measured at a maximum induction $B_{max}$ of 2.0 T and a frequency of 400 Hz. With some compositions and strip thicknesses it proved impossible to measure the losses at 400 Hz because the absolute losses were too high for the measuring set-up used.

At a strip thickness of 0.35 mm, reference sample A1 with 1.87 wt % V has relatively low losses, e.g. 1.38 W/kg at 1.5 T and 50 Hz, and 378 W/kg at 2.0 T and 1 kHz. In this case, the low losses are primarily attributable to the high electrical resistance of over 40 µΩcm.

Owing to the even higher resistances, reference B2. i.e. the variant with an increased V content of 2.49 wt %, shows smaller losses at 2.0 T and 1 kHz than A1 at the same strip thickness. However, as coercive field strength is higher, losses at 1.5 T and 50 Hz are also higher.

V-free reference C2 with only the addition of Nb exhibits very high losses over the entire frequency range because the electrical resistance is unacceptably low for dynamic applications at less than 10 µΩcm.

Example G2 with composition G according 0.97 wt % V to the invention with, on the other hand, exhibits significantly lower losses than the comparative example C2 without V at a strip thickness of 0.35 mm and after annealing at 925° C.

Examples G3 and G4 illustrate that a further improvement in losses is possible by reducing the strip thickness to 0.15 mm. The loss values at 400 Hz and 1000 Hz are below the values measured for reference example A1 due to the significant reduction in thickness. This shows that losses at 50 Hz also fall below those of the reference due, in particular, to the annealing process at 925° C. according to the invention. This can be attributed to the low coercive field strength resulting from the high annealing temperature.

As composition H with only 0.70 wt % already has a very low electrical resistance of only 22.8 µΩcm, the use of a thin strip thickness is particularly expedient. Here, too, when annealing is carried out at 925° C. as disclosed in the invention, the loss values measured for example H4 are all below those of comparative example A1.

TABLE 3

| | R/Inv | d mm | $T_{max}$ °C. | t h | PFe 1.5 T 50 Hz W/kg | PFe 1.5 T 400 Hz W/kg | PFe 1.5 T 1 kHz W/kg | PFe 2.0 T 50 Hz W/kg | PFe 2.0 T 400 Hz W/kg | PFe 2.0 T 1 kHz W/kg | Sample |
|---|---|---|---|---|---|---|---|---|---|---|---|
| A1 | R | 0.35 | 880 | 6 | 1.38 | 33.8 | 177.0 | 2.32 | 65.8 | 378 | 1802188 |
| B2 | R | 0.35 | 830 | 6 | 1.86 | 21.6 | 170.0 | 2.82 | 56.9 | 302 | 1802203 |
| O2 | R | 0.35 | 970 | 4 | 3.23 | 115.0 | — | 5.58 | 237.0 | — | 1900141 |
| G2 | Inv | 0.35 | 925 | 6 | 1.76 | 47.5 | 251.0 | 2.79 | 92.8 | 469 | 1804102 |
| G3 | R | 0.15 | 880 | 6 | 1.57 | 22.9 | 89.9 | 2.43 | 36.6 | 156 | 1900151 |
| G4 | Inv | 0.15 | 925 | 6 | 1.18 | 19.9 | 79.1 | 1.78 | 31.6 | 142 | 1905349 |
| H3 | R | 0.15 | 880 | 6 | 1.64 | 24.5 | 95.7 | 2.57 | 39.5 | 166 | 1900152 |
| H4 | Inv | 0.15 | 925 | 6 | 1.29 | 21.7 | 84.4 | 1.96 | 34.8 | 158 | 1905347 |

Table 3 shows magnetisation losses $P_{Fe}$ as a function of annealing at the annealing temperatures disclosed in the invention (Inv) and reference annealing processes (R).

Figure 4:
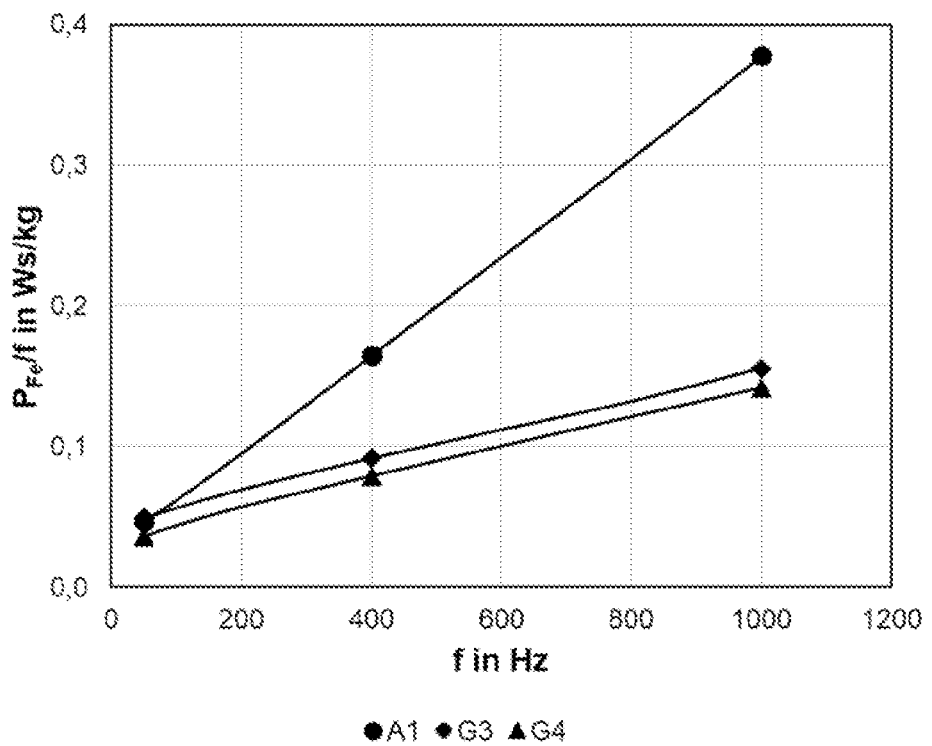
FIG. 4 shows a graph of magnetisation losses $P_{Fe}/f$ per cycle at $B_{max}=2$ T as a function of frequency.

In FIG. 4 magnetisation losses $P_{Fe}/f$ per cycle are plotted against frequency. Maximum induction $B_{max}$ is 2 T. The points at 50 Hz, 400 Hz and 1000 Hz are marked with symbols because they correspond to the measuring points in Table 3.

Example A1 at 0.35 mm represents the reference state in terms of both the addition of vanadium (1.89 wt %) and annealing (880° C.). Example G3 shows that it is possible to overcompensate for the rise in eddy-current losses associated with the reduced V content of 0.97 wt % by reducing the strip thickness to 0.15 mm. This can be seen on the graph from the significantly flatter gradient of the loss line G3 in comparison to A1.

However, as the Hc for state G3 is similar to the value for reference A1, hysteresis losses, i.e. the points of intersection with the y-coordinates, are at the same level. Annealing at 925° C. (G4) reduces coercive field strength and so hysteresis losses. This can be seen on the graph from a parallel downward shift of G4 in relation to G3.

Example G4 demonstrates that with composition G according to the invention reducing the strip thickness in combination with annealing according to the invention achieves losses that lie below the reference curve A1 throughout the whole frequency range.

Examples J to P represent compositions according to the invention, compositions J to N having different Mn contents of 0 wt % Mn, 0.06 wt % Mn and 0.37 wt % Mn respectively. Compositions K, L, O and P have different Nb contents of 0 wt % Nb, 0.05 wt % Nb and 0.06 wt % Nb respectively. Compositions K to P have different Co contents of 49.1 wt % to 49.3 wt % Co.

The alloys in examples J to P were processed to form strips of two different final thicknesses d=0.35 mm and 0.1 mm.

Table 2 shows that examples J to P have magnetic properties of J(16 kA/m)≥2.30 T, μmax>25,000 and Hc≤30 A/m with final annealing at $T_{max}$>900° C.

Example Q has a higher Nb content von 0.19 wt % and shows the effect of a Nb content beyond the range claimed. As shown in Table 2, the magnetic properties of the alloy are not so good despite final annealing at $T_{max}$>900° C. because the coercive field strength Hc achieved is only 49.8 A/m and the maximum permeability μmax only 14,149.

Figure 5:
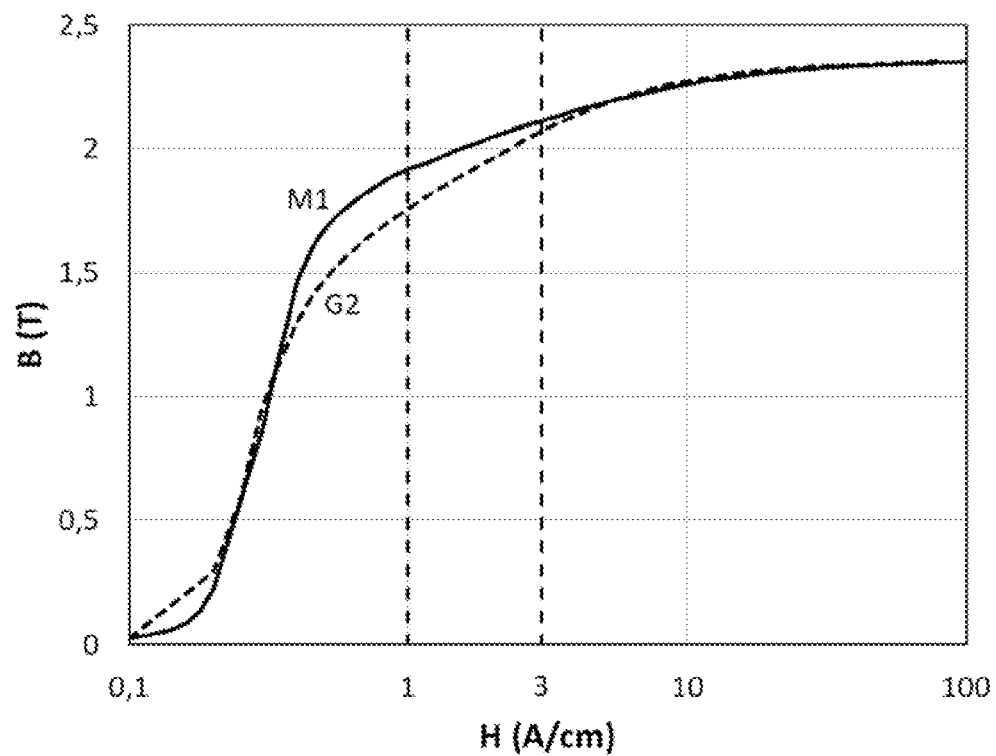
FIG. 5 shows initial magnetization curves for embodiments G2 and M1 with 1% V.
Figure 6:
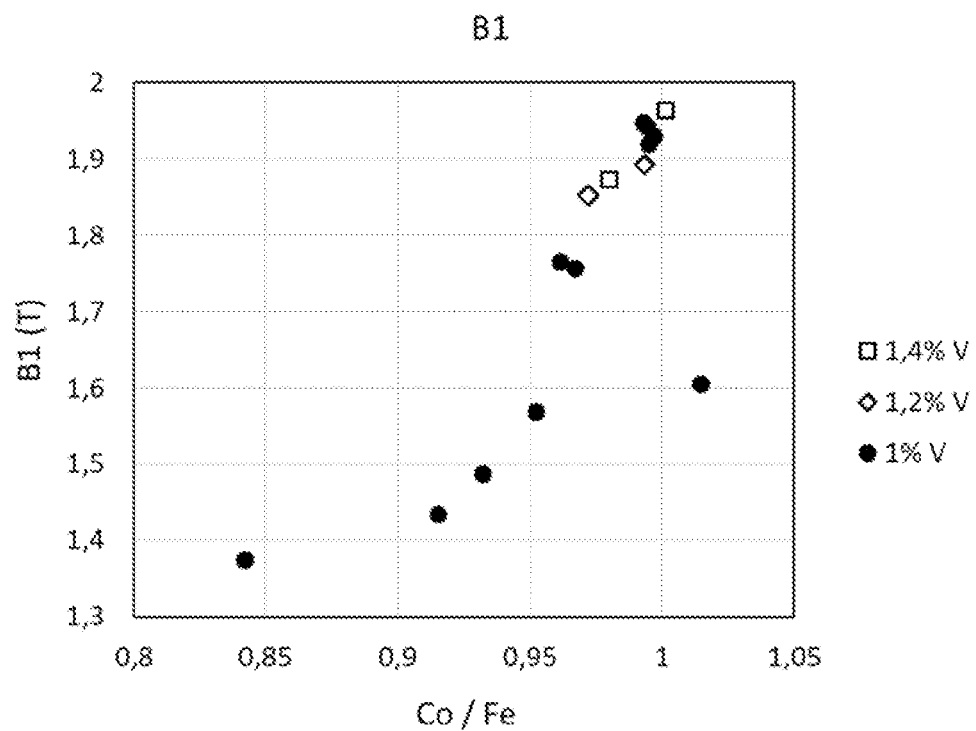
FIG. 6 shows a graph of induction B1=B(1 A/cm) as a function of Co/Fe ratio, the Co/Fe ratio being calculated from the wt % without taking the contents of impurities C, S, N and O into account in the calculation.
Figure 7:
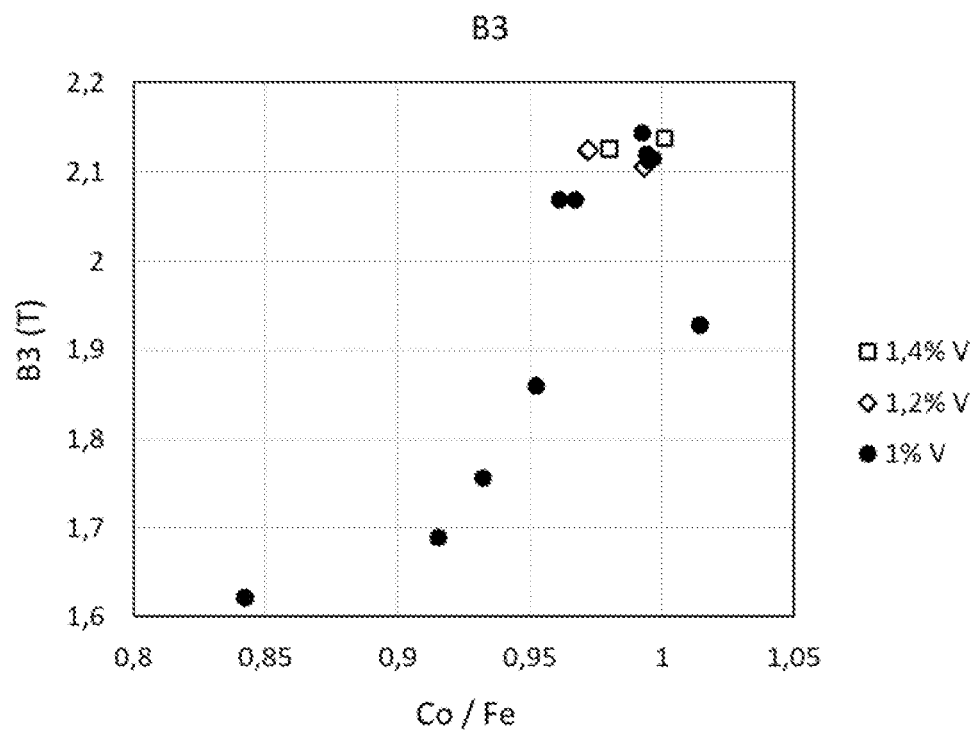
FIG. 7 shows a graph of induction B3=B(3 A/cm) as a function of Co/Fe ratio, the Co/Fe ratio being calculated from the wt % without taking the contents of impurities C, S, N and O into account in the calculation.
Figure 8:
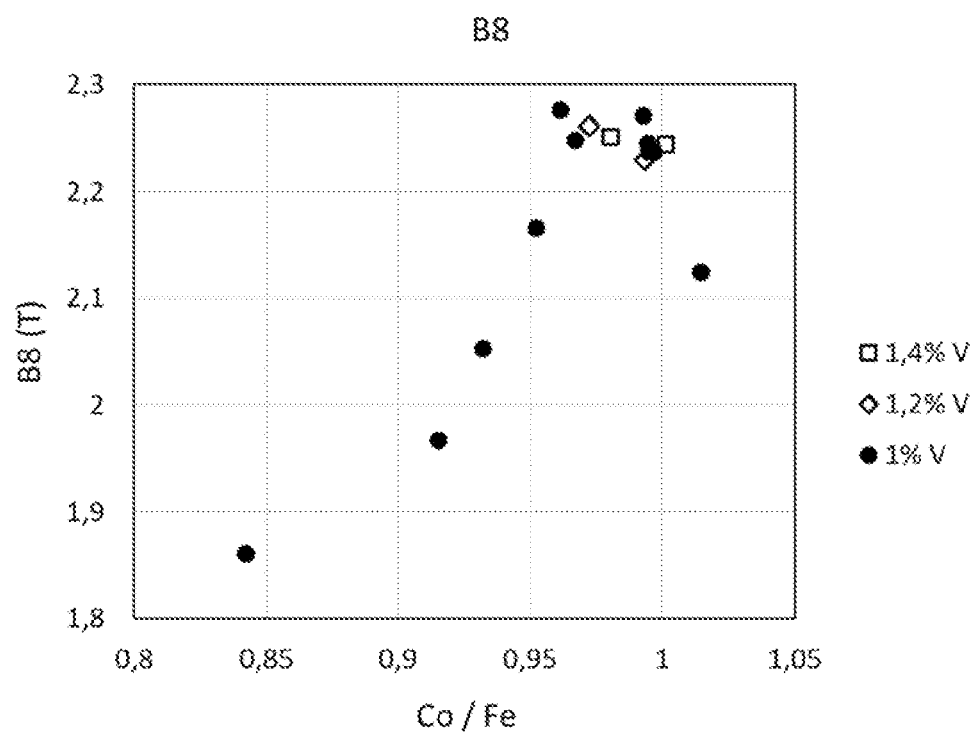
FIG. 8 shows a graph of induction B8=B(8 A/cm) as a function of Co/Fe ratio, the Co/Fe ratio being calculated from the wt % without taking the contents of impurities C, S, N and O into account in the calculation.

The Co content can be defined further by the Co/Fe ratio. Analysis of the initial magnetization curves with a 0.35 mm strip thickness shows that some compositions have a flattened curve around H=1 A/cm that is visible in a logarithmic representation of field strength, in particular. This is demonstrated in FIG. 5 in relation to embodiments G2 and M1.

The two examples G2 and M1 have a very similar composition with 1% V. While the initial magnetization curve of M1 at H=1 A/cm already achieves a B1 (i.e. B at H=1 A/cm) of 1.92 T, the initial magnetization curve of G2 is significantly flatter in this region and achieves a B1 value of only 1.757 T. By contrast, the two curves once again run almost level at a field strength of 3 A/cm and achieve B3 values (i.e. B at H=3 A/cm) of over 2 T. The B1 value is therefore particularly suitable for quantifying the effect of the flattened magnetization curve.

The clearest difference in the compositions of embodiments G and M lies in the Co content, which is 48.55% in example G and 49.3% in example M. It can therefore be assumed that the more favourable initial magnetization curve shape in example M1 is achieved due to the higher Co content.

However, the lower Co content in composition G is close to composition A. In contrast to composition G, composition A has no flattened region around H=1 A/cm in the initial magnetization curve. Despite the lower Co content, the shape of the initial magnetization curve in example A1 corresponds to the more favourable curve of example M1.

The Co/Fe ratio in the alloys shifts significantly an identical absolute Co content owing to the wide variation in V content. In addition to texture formation, the Co/Fe ratio in the alloys can most notably influence order and so magnetocrystalline anisotropy and so the soft magnetic properties that can be achieved. The Co/Fe ratio is therefore taken into consideration and is always indicated below as the ratio calculated from the wt % of Co and Fe, without taking the contents of impurities C, S, N and O into account in the calculation.

In compositions A and M the Co/Fe ratios are similarly high at values of 0.990 and 0.995 respectively. In composition G with the flattened initial magnetization curve, in contrast, the Co/Fe ratio is lower at a value of 0.967. This behaviour is confirmed in other embodiments with 1% V and 0.35 mm strip thickness. In example J1 with a low Co/Fe ratio of 0.961 a B1 of only 1.765 T is also achieved. In examples K1, L1 and N1, in contrast, the Co/Fe ratio is within a range of 0.993 to 0.997 and B1 values greater than 1.9 T are consistently achieved.

The effect of Co/Fe ratio over a wider range was examined using compositions R to V, which cover a Co/Fe ratio range of 0.842 to 1.014 with a constant V content of 1%. The alloys with compositions R to V were rolled to 0.35 mm and subjected to magnetic final annealing according to the invention at temperatures above 900° C. and below the phase transition α/α+γ. They are listed in Table 2 as examples R1 to V1.

Table 2 shows that the desired magnetic properties can no longer be achieved if Co/Fe ratios are too low or too high.

In both example R1 with the lowest Co/Fe ratio of 0.842 and example V1 with the highest Co/Fe ratio of 1.014, Hc is above 30 A/m. In examples R1 to T1, where Co/Fe≤0.932, μmax is below 25,000. The same applies to example V1, which has the highest Co/Fe ratio of 1.014. The Co/Fe ratio should therefore be between 0.94 and 1.01, i.e. 0.94≤Co/Fe≤1.01.

A more detailed evaluation is provided in FIGS. 6 to 9. They plot magnetic parameters B1, B3, B8 and remanence Br against Co/Fe ratio. The data are grouped according to V content and also include examples with V contents of 1.2% and 1.4%. The graphs show the following examples from Table 2:

A composition with 1% V: G2, J1, K1, L1, M1, N1, R1, S1, T1, U1, V1

A composition with 1.2% V: E2, O1

A composition with 1.4% V: D2, P1

In FIGS. 6 to 9 a sharp drop in magnetic values between Co/Fe≤1.000 and Co/Fe=1.014 (example V1) indicates an upper Co/Fe ratio limit. The upper Co/Fe ratio limit is therefore at Co/Fe≤1.01 or preferably Co/Fe≤1.005.

An advantageous lower Co/Fe ratio limit is heavily dependent on the parameter being considered:

the B8 value forms a plateau at a constantly high B8>2.2 T between 0.96≤Co/Fe≤1.00;

the B3 value forms a plateau at a constantly high B3>2.1 T between 0.97≤Co/Fe≤1.00;

the B1 value has a peak maximum B1>1.9 T in a very narrow range of 0.99≤Co/Fe≤1.00.

As a result, a Co/Fe ratio of between 0.94 and 1.01, i.e. 0.94≤Co/Fe≤1.01, preferably 0.97≤Co/Fe≤1.005, is suitable for achieving the desired combination of magnetic properties, i.e. high induction values at low field strength H, the Co/Fe ratio being calculated from the wt % of Co and Fe without taking the contents of impurities C, S, N and O into account in the calculation.

Production of a Laminated Core

Strips of the alloy according to the invention can be processed further in various manners for use in electrical machines. Examples of the production of laminations and laminated cores for use in electrical machines are given below. The methods proposed can be used for both rotationally symmetrical parts for rotating motors and for elongated parts for linear motors. They can also be used for generator applications.

The embodiments described below correspond to typical production routes for FeCoV alloys and are intended to demonstrate by way of example how these routes can be transposed to the alloy according to the invention. The term laminated core is used to refer not only to stators and rotors, but also to the segments and individual teeth that go to make up stators.

Coating

In an example the strip according to the invention is first coated with a Mg-methylate-based coating referred to as DL1, which is transformed into magnesium oxide during the subsequent magnetic final annealing and so both serves as an annealing separator and provides additional insulation between adjacent layers. In another example a Zr-propylate-based coating called HITCOAT that is present after annealing as zirconium oxide is used instead.

After annealing, these coatings are very thin with layer thicknesses of less than one micrometre. Where thicker layer insulation in the region of a few μm is required, a plastic-bonded boehmite-based coating, for example, that transforms into $Al_2O_3$ during final annealing, can be used.

Annealing, Bonding, Electrical Discharge Machining

In an embodiment metal sheets are cut to length from the coated strip. These metal sheets are stacked one on top of another, weighted down where necessary and subjected to heat treatment according to the invention. The annealed sheets are then stuck to one another to form a block. The contour of the laminated core is then machined from this block by means electrical discharge machining. This method is primarily suitable for small quantities and for prototypes in which the design has not yet been finalised.

Annealing, Laser Cutting, Joining

In a further embodiment individual sheets, also known as laminations, are manufactured from the strip or from the sheets made from the strip by means of laser cutting. These individual sheets are then stacked on top of one another or suspended on one or more rods and subjected to the heat treatment according to the invention in this arrangement. They are then joined together to form the laminated core by bonding the laminations together, for example.

In a further example the annealed sheets are joined together by means of a laser weld seam. Optionally, the core produced in this manner can be annealed again in order to compensate for the structural damage caused by the welding. This additional second heat treatment, also referred to as repair annealing, need not necessarily be carried out at temperatures above 900° C. It is generally sufficient to carry it out at a temperature over 600° C. in order to repair dislocations.

In order to anticipate the longitudinal growth that occurs when FeCoV is annealed the metal sheets can also be annealed before laser cutting, resulting in a change in length due to the change in order (ordering). Laminations are then formed from the annealed metal sheets by means of laser cutting. The sheets formed in this manner then undergo magnetic final annealing once more. The length of the material does not change during this second annealing process since the material is already in the ordered state. With this method it is sufficient if only one of the two annealing processes takes places at the temperatures disclosed in the invention. However, the dwell temperature should be above the order-disorder transition $T(\alpha'/\alpha)$ in both annealing processes.

By way of example, for an alloy comprising 49 wt % Co, 1.1 wt % V, 0.05 wt % Nb and the rest Fe the metal sheets can be heat treated in dry hydrogen at only 820° C. for a period of 6 h. The heat treatment of the cut laminations is then also carried out in dry hydrogen according to the invention at 920° C. for a period of 6 h. The order of these annealing processes may also be reversed.

Punching, Annealing, Laser Welding

The method involving the punching of individual sheets is suitable for the series production of laminated cores. In an embodiment the laminations are therefore punched and then subjected to heat treatment according to the invention in order to set the magnetic properties. To this end, the sheets are placed in stacks comprising a plurality of sheets, for example, and weighted down with a plate as required. Alternatively, the parts may be hung on one or more rods and annealed hanging.

The heat treatment takes place at a temperature of at least 900° C. and below temperature $T(\alpha/\alpha+\gamma)$. For the best results, the temperature should be below but as close as possible to $T(\alpha/\alpha+\gamma)$.

In an example the laminations are subjected to oxidation annealing following final annealing. The intentional transformation of the layer close to the surface into an oxide improves the electrical insulation of adjacent laminations.

The oxidation may be carried out in air at 350° C. to 500° C. for a period of 0.5 h to 5 h, for example.

The annealed and, if desired, oxidised laminations can then be stacked to form a laminated core and joined together. In an example the laminations are joined together by means of laser welding. This may be achieved by means of one or more weld seams along the direction of stacking, for example.

Alternatively, adjacent sheets can be joined together by one more weld spots, it being possible to offset the weld spots in relation to one another along the height of the sheet. This arrangement results in longer paths for the eddy currents created by contacting and thus in higher electrical resistance.

Optionally, the core obtained in this manner can be subjected to further heat treatment in order to repair the damage caused by the welding. In this case, it is sufficient for one of the two heat treatment process to be carried out at annealing temperatures according to the invention, i.e. either the annealing of the individual laminations or the annealing of the assembled core.

By way of example, for an alloy according to the invention comprising 49 wt % Co, 1.0 wt % V and the rest Fe, the punched laminations can be heat treated in dry hydrogen at a temperature of 940° C. for a period of 12 h. The annealing of the assembled core is then carried out also in dry hydrogen at a temperature of 820° C. for a period of 4 h. The order of these annealing processes may also be reversed.

Punching, Annealing, Bonding

In an example the laminations annealed according to the invention are then stuck together by adhesive (bonded). In this case, no further heat treatment of the core is carried out.

Punching, Laser Welding, Annealing

In a further embodiment the laminations are produced by punching, then stacked and joined together by laser welding. In this case, final annealing of the assembled core is imperative. This heat treatment should also be carried out using the annealing process according to the invention.

In-Die Stacking, Annealing

A further option, suitable for the series production of cores, is in-die stacking, i.e. laminations are punched from the coated strip in the die, where they are then joined together by bonding points. The core thus obtained should then undergo heat treatment, which should be carried out in accordance with the invention at temperatures above 900° C.

The invention claimed is:

1. A method for the production of a strip from a FeCoV alloy, the method comprising:
   providing a melt comprising 30 wt %≤Co≤55 wt %,
   0.4 wt %≤V≤1.5 wt %,
   0.0 wt %≤Nb≤0.15 wt %,
   0.0 wt %≤Ta≤0.20 wt %,
   0.04 wt %≤Nb+0.5·Ta≤0.15 wt %,
   max. 0.02 wt % C,
   0.0 wt %≤Si≤0.50 wt %,
   0.0 wt %≤Al≤0.50 wt %,
   max. 0.5 wt % Mn, max. 0.5 wt % Cr, max. 0.5 wt % Ni, max. 0.5 wt % W, max. 0.5 wt % Mo, max. 0.5 wt % Zr,
   the rest Fe and up to 1 wt % of impurity elements,
   wherein the FeCoV alloy has a phase transition from a ferritic α-phase region to a mixed ferritic/austenitic α+γ-region that takes place at a transition temperature $T(α/α+γ)$, where $T(α/α+γ)≥910°$ C.,
   wherein the vanadium content of the melt is selected such that $T(α/α+γ)≥910°$ C.,
   casting the molten mass in vacuum and then solidifying it to form an ingot,
   hot rolling the ingot to form a slab and then to form a hot-rolled strip with a thickness $d_1$, followed by quenching of the strip from a temperature above an order-disorder transition $T(α'/α)$ to a temperature below 200° C.,
   cold rolling the hot-rolled strip to form a strip with a thickness $d_2$, where $d_2<d_1$,
   heat treating the strip at a temperature $T_{max}$ and a dwell time t, where $T_{max}≤T(α/α+γ)$ and $T_{max}≥910°$ C.

2. A method according to claim 1, wherein $T_{max}≤T(α/α+γ)$ and $T_{max}≥920°$ C.

3. A method according to claim 1, wherein a difference ΔT between the phase transition $T(α/α+γ)$ and the temperature $T_{max}$ is no more than 20° C.

4. A method according to claim 1, wherein t is at least 0.5 h.

5. A method according to claim 1 including cooling from $T_{max}$ to 700° C. at a rate A that is no greater than 1000° C./h.

6. A method according to claim 1, wherein $d_2≤0.35$ mm.

7. A method according to claim 1, wherein $d_1≤3.5$ mm.

8. A method according to claim 1, wherein before the heat treatment the strip is coated with a Mg-methylate-based coating, a Zr-propylate-based coating or a boehmite-based coating.

9. A method according to claim 8, wherein the strip has an oxide layer after the heat treatment.

10. A method according to claim 1, wherein after hot rolling, the hot-rolled strip is quenched from a temperature $T_1$ that lies between the order-disorder transition $T(α'/α)$ and the transition temperature $T(α/α+γ)$, where $T(α'/α)≤T_1≤T(α/α+γ)$.

11. A method according to claim 10, wherein in order to quench the hot-rolled strip the hot-rolled strip is quenched from $T_1$ to 100° C. at a cooling rate of at least 500 K/s.

12. A method according to claim 11, wherein the hot-rolled strip is quenched in an ice and salt water bath from $T_1$ to 100° C. at a cooling rate of at least 500 K/s.

13. A method according to claim 1, wherein before cold rolling the strip is preheated to a temperature between 20° C. and 300° C.

14. A method according to claim 13, wherein a plurality of cold-rolling steps are carried out, and the strip is preheated to a temperature between 20° C. and 300° C. between cold rolling steps.

15. A method according to claim 1, wherein after heat treatment the strip comprises the following:
   a polarisation $J(16 \text{ kA/m})≥2.30$ T, and/or
   a maximum permeability μmax>25,000, and/or
   a coercive field strength Hc≤30 A/m, and/or
   and an electrical resistance of at least 0.15 μΩm.

* * * * *